(12) United States Patent
Lin et al.

(10) Patent No.: US 11,900,296 B1
(45) Date of Patent: Feb. 13, 2024

(54) SUSTAINABLE DIGITAL TWIN SYSTEM

(71) Applicant: Visionaize Inc, San Jose, CA (US)

(72) Inventors: Mandy Lin, San Jose, CA (US);
Martin Stook, San Jose, CA (US);
David Reinhart, San Jose, CA (US)

(73) Assignee: Visionaize Inc., San Jose, CA (US)

( * ) Notice: Subject to any disclaimer, the term of this patent is extended or adjusted under 35 U.S.C. 154(b) by 0 days.

(21) Appl. No.: 18/330,453

(22) Filed: Jun. 7, 2023

(51) Int. Cl.
*G06Q 10/0637* (2023.01)
*G06F 30/12* (2020.01)
*G06F 30/13* (2020.01)

(52) U.S. Cl.
CPC ....... *G06Q 10/06375* (2013.01); *G06F 30/12* (2020.01); *G06F 30/13* (2020.01)

(58) Field of Classification Search
None
See application file for complete search history.

(56) References Cited

U.S. PATENT DOCUMENTS

| | | | | |
|---|---|---|---|---|
| 11,200,045 | B1* | 12/2021 | Moyal | G06F 11/3442 |
| 2017/0323274 | A1* | 11/2017 | Johnson | G05B 13/041 |
| 2019/0155271 | A1* | 5/2019 | Matthews | G05B 15/02 |
| 2021/0109506 | A1* | 4/2021 | Malakuti | G05B 19/4166 |

FOREIGN PATENT DOCUMENTS

EP  3483799 A1 * 5/2019 ....... G06Q 10/06311

OTHER PUBLICATIONS

Marco et al "Exploring the role of Digital Twin for Asset Life Management", Dec. 2018, IFAC Papers On Line 51-11, pp. 790-795 (Year: 2018).*

* cited by examiner

*Primary Examiner* — Romain Jeanty
(74) *Attorney, Agent, or Firm* — Kevin J Fournier Intellectual Property Legal Services Ltd; Kevin J Fournier

(57) ABSTRACT

Embodiments of system and method for a sustainable digital twin system, are described. In one aspect, the sustainable digital twin system includes a cooperative working of multiple engines to enable managing virtual assets corresponding to each physical asset in a facility. The sustainable digital twin system may implement a manage of change (MoC) mechanism to track and manage modifications of the virtual assets in the facility. The modifications of the virtual assets may be simulated in a work-in-progress environment. The impact of the modifications of the modified virtual asset and the other virtual assets in the facility may be analyzed. Upon analysis, an end user may review suggestions or recommendations provided by the sustainable digital twin system, update and implement the modifications in the work-in-progress environment, before propagating the modifications to a production environment.

20 Claims, 13 Drawing Sheets

SUSTAINABLE DIGITAL TWIN SYSTEM

FIELD

Various embodiments of the disclosure relate to a sustainable digital twin system. More specifically, the various embodiments are related to a system and method that implements a mechanism to enable managing changes or modifications of digital twin assets or virtual assets in an industry or a facility.

BACKGROUND

Industries or facilities may include physical objects that may be updated or upgraded on a time-to-time basis. The physical objects may be represented by a corresponding digital asset. When such updates or upgrades are conducted, the updates may not be reflected in a corresponding digital asset. Further, tracking and managing if the updates or upgrades have been accurately propagated may not only be time consuming, but also complicated. For example, the complications may not be limited to reimporting the digital assets to accurately reflect the updates or upgrades from the corresponding physical objects, delinking or disconnecting existing data connections with the other digital assets, temporarily terminate user access to propagate the corresponding upgrades or updates thereby leading to downtime of the facility.

Further, limitations may include lack of a centralized platform to review the upgrades or updates to ensure that the data is consistent, and all links and data connections are reestablished. Therefore, providing a platform that implements a mechanism to centrally monitor and manage the digital assets without any disruptions or downtime, may be challenging.

The limitations and disadvantages of conventional and traditional approaches will become apparent to one of skill in the art, through comparison of described systems with some aspects of the present disclosure, as set forth in the remainder of the present application and with reference to the drawings.

SUMMARY

A system, method, and a non-transitory computer readable device of a sustainable digital twin system are described.

These and other features and advantages of the present disclosure may be appreciated from a review of the following detailed description of the present disclosure, along with the accompanying figures in which like reference numerals refer to like parts throughout.

DETAILED DESCRIPTION

Figure 1:
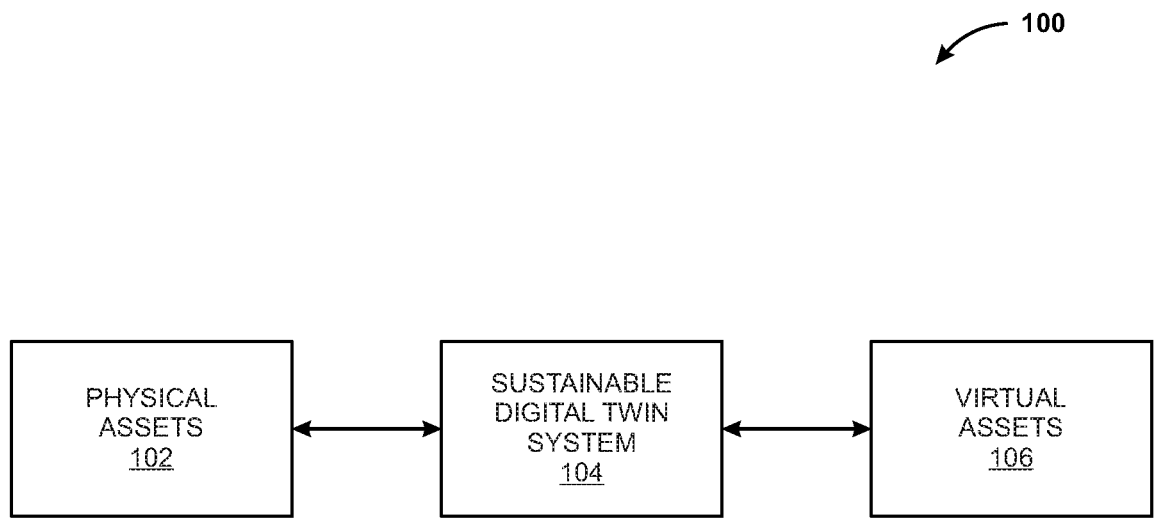
FIG. 1 is a block diagram illustrating an environment including a sustainable digital twin system, according to an exemplary embodiment.

Technological advancements have propelled simplified ways to manage an entity or a facility. For instance, in certain facilities such as an oil field facility, seamless operations management of assets or objects of the facility with minimal or no interruptions or downtime, may be important. Further, for managing larger facilities that include multiple physical assets or physical objects that may work in cooperation and have a centralized platform that enables provisioning insights into operations executed by the multiple physical assets may be vital. In an embodiment, the deployment of a sustainable digital twin system in such facilities may enable monitoring and management of such facilities. For instance, the sustainable digital twin system may execute operations to model the physical assets or physical objects of the facility and generate a corresponding digital twin assets or 3D virtual models. Such 3D virtual models or the digital twin assets may be referred to as virtual assets. Such virtual assets may be accurately modeled to reflect the corresponding physical assets enabling certainty and linked asset data consistency.

In an embodiment, the sustainable digital twin system may enable modeling the virtual assets to include granular level details including data associated with linked asset data of other virtual assets in the facility. When the virtual assets are updated, upgraded, or modified, the sustainable digital twin system may enable providing a platform to simulate such modifications. Further, the simulations may enable an end user to perform a multidimensional analysis. For example, such multidimensional analysis may include analyzing the effect of modifications including the data that may be affected, an impact on corresponding files, an impact on a corresponding attribute associated with the virtual assets, and an impact on the linked asset data of other virtual assets in the facility. Further, the sustainable digital twin system may provide information that may be consumed by key stakeholders, assigned users, administrator, managers, etc., of the facility and implement further action steps.

In an embodiment, simulating the modifications of the virtual asset in real time may be reflected in a corresponding physical asset and the effects of the modifications may be analyzed from a real-world perspective. The sustainable digital twin system may enable visualizing the modifications at a granular level detail, before propagating them to a production environment or the real work environment. For example, an administrator or manager of the sustainable digital twin system may visualize the changes in the virtual assets and its related data and may be able to compare the changes with the current production data, before publishing the modifications in the production environment.

In an embodiment, the sustainable digital twin system may enable a high level of asset certainty. For example, a higher level of asset certainty may provide a high level of accuracy of replication and certainty of the virtual assets thereby matching the physical assets. In an embodiment, an as-designed model may represent the initial design of a project, based on the specifications, requirements, and design intent of the architects, engineers, and other stakeholders. Such a model may serve as the blueprint for the construction process and includes details such as geometry, dimensions, materials, and components. For example, the as-designed models are typically developed using Computer-Aided Design (CAD) or Building Information Modeling (BIM) software.

In an embodiment, an as-built model may be a digital representation of the project after it has been constructed, reflecting any modifications or deviations from the original design that occurred during the construction process. Such a model may serve as the final, accurate record of the completed project and includes information such as as-built dimensions, installed materials, component adjustments, and any other changes made during construction. For example, the as-built models can be developed using a combination of CAD/BIM software and data gathered from site surveys, laser scanning, and other measurement techniques.

In an embodiment, the as-designed and as-built models may not be the same due to various factors that may cause deviations during the construction process. Some common reasons for discrepancies between the as-designed and as-built models include:

Design Changes: Design changes may be needed during construction due to factors such as changing project requirements, value engineering, or updated regulations.

Field Adjustments: During construction, field adjustments may be necessary due to site conditions, unforeseen obstacles, or fabrication errors. These adjustments can result in deviations from the original design.

Material and Component Variations: The actual materials and components used during construction may be different from those specified in the as-designed model due to factors such as availability, cost, or performance. Such variations may cause differences between the as-designed and as-built models.

Human Error: Mistakes can occur during the construction process due to misinterpretation of design documents, measurement errors, or other factors. These errors may result in deviations from the original design.

Tolerances and Construction Methods: Construction methods and tolerances may also cause discrepancies between the as-designed and as-built models. For example, a concrete structure might not be perfectly aligned due to formwork movement, or a steel structure might have slight dimensional variations due to fabrication tolerances.

In an embodiment, understanding the differences between as-designed and as-built models is crucial for accurate project documentation, facilities management, and future renovations or modifications. By maintaining an up to date as-built model, organizations can ensure that they have a reliable record of their assets, which may simplify and streamline maintenance, improve decision-making, and reduce the risk of errors in future projects. In an embodiment, similar to the physical facility, the virtual models may not be a single entity, as certain physical assets may have undergone changes since the facility was commissioned. Similarly, some virtual assets may have been updated to reflect their physical assets, while others may not have accurately reflected their physical assets yet.

In an embodiment, the sustainable digital twin system may enable assigning levels of certainty to the assets. For example, factors or attributes like asset physical accuracy, asset engineering accuracy, virtual asset state, etc., may be used to accurately determine the virtual assets certainty. In an embodiment, the asset physical accuracy may provide information on the physical accuracy of an asset, including its dimensions, position, and orientation, is indicated by this factor. The sustainable digital twin system may assign an enumerated level of accuracy to this factor, which a user can observe and base assumptions on regarding which actions or activities are feasible. In an embodiment, knowing that a system is physically accurate may provide the necessary confidence to a user to perform certain engineering activities, for example, accurately measuring and designing a piping bypass.

In an embodiment, the asset engineering accuracy may provide information of the asset's engineering meta data accuracy. The sustainable digital twin system may assign an enumerated level of accuracy. In an embodiment, the sustainable digital twin system may enable tagging accurately and providing up to date engineering meta data like material, operating temperature and pressure may provide the confidence that a user can perform inspections activities. For example, the inspection activities may include the plan to inspect a corrosion circuit in the facility.

In an embodiment, the virtual asset state may provide information about the state of a virtual asset and its relationship to the knowledge of maintenance activities in the physical facility. The sustainable digital twin system integrated and working in conjunction with the organization's Enterprise Asset Management (EAM) system may determine whether an asset's state reflects any performed maintenance activities.

In an embodiment, in the foregoing description, the sustainable digital system may include and implement decision-based logics, multiple interfaces, engines and/or models, frameworks, one or more circuitries and/or code executable by the one or more circuitries. The engines and/or models, frameworks, etc., implemented by the sustainable digital system may execute operations or functions, either independently or in cooperation. An engine may correspond to a special purpose program or an executable code that performs or executes one or more core functions or operations. Modelling may correspond to a mechanism or a process that includes creating or improvising a functional or operational aspect of a system or one or more features of the system by referencing an existing or known knowledge base. The outcome of the modeling process is to simplify the functional or operational aspect of the system or one or more features of the system that can be easily understood, quantified, and visualized. The mechanism for modeling may be automated through a continual process of training the model with data from multiple sources. The engines and/or the models may implement an execution of the one or more core functions or operations based on configured one or more rules and/or one or more sequence of sequence of steps to produce specific outcomes. The engines and/or models may be configured to work either independently or in conjunction with one or more engines or one or more models.

The terms machine learning model or machine learning engine may be used to refer to a computational or statistical or mathematical model or engine that may be trained using machine learning modelling techniques. The machine learning model or the machine learning engine may be trained using a data set and an algorithm that it may use to learn, or model based on the information in the data set.

The term artificial intelligence may be used to refer to a model built using simple or complex Neural Networks using deep learning techniques and computer vision algorithms. Artificial intelligence model learns from the data and applies that learning to achieve specific pre-defined objectives.

FIG. 1 is a block diagram illustrating an environment 100 including a sustainable digital twin system, according to an exemplary embodiment. With reference to FIG. 1, there is shown an environment 100 that includes a communicatively coupled arrangement of physical assets 102, a sustainable digital twin system 104, and a corresponding virtual asset 106. In an embodiment, the sustainable digital twin system 104 may be deployed in an entity or a facility and may enable managing the physical assets 102 of the entity or the facility. The physical assets may execute specific operations independently or in cooperation and may assist in achieving certain desired operations. In an embodiment, the sustainable digital twin system 104 may receive data or information associated with, for example, the physical assets 102. The sustainable digital twin system 104 may execute operations to model the physical assets 102 to generate 3 dimensional (3D) virtual models corresponding to each physical asset. In the foregoing description, the terms digital twin assets, 3D virtual models, 3D virtual assets, digital twin assets, and the virtual assets 106 may be used interchangeably and may correspond to the 3D virtual models or virtual assets 106 of a facility.

In an embodiment, the sustainable digital twin system 104 may implement a mechanism, for example, a management of change (MoC) to enable tracking and managing modifications of the virtual assets 106. The MoC mechanism may enable simulating the modifications of the virtual assets 106 in real time and analyze the impact of the modifications on the modified virtual assets and other virtual assets 106 in the facility. In an embodiment, the MoC mechanism may enable executing operations such as analyzing, visualizing, reviewing recommendations or suggestions, updating, accepting, and implementing the modifications of the virtual assets 106. Upon accepting and implementation, the modifications may be synchronized in real time without interrupting the ongoing operations in the facility. Such a mechanism of uninterrupted operations may eliminate situations that may lead to downtime of the facilities.

For example, consider an oil refinery facility, and a scenario where a bypass pipeline may be added to the existing arrangement of the physical assets of the oil refinery. In such a scenario, an end user, for example, a manager or administrator of the sustainable digital twin system 104 may create tasks and workorders for adding the bypass pipeline. Further, there may be other tasks or subtasks created by the administrator or the manager that may be a part of the work order. In an embodiment, the sustainable digital twin system 104 may enable a mechanism to model the physical assets 102 of the oil refinery and create or generate the virtual assets 106 corresponding to the physical assets 102. Further, the sustainable digital twin system 104 may provision executing operations of simulating the addition of the bypass pipeline, perform linked asset data validations and analysis, generate visualizations, and provide recommendations or suggestions. In an embodiment, the above-described simulation may be performed in, for example, a work-in-progress environment and the impact of the modification including the addition of the bypass pipeline may be analyzed. Based on the analysis, the administrator or the manager or the assigned end user may execute further operations and publish or propagate the modifications to a real time production environment.

Figure 2A:
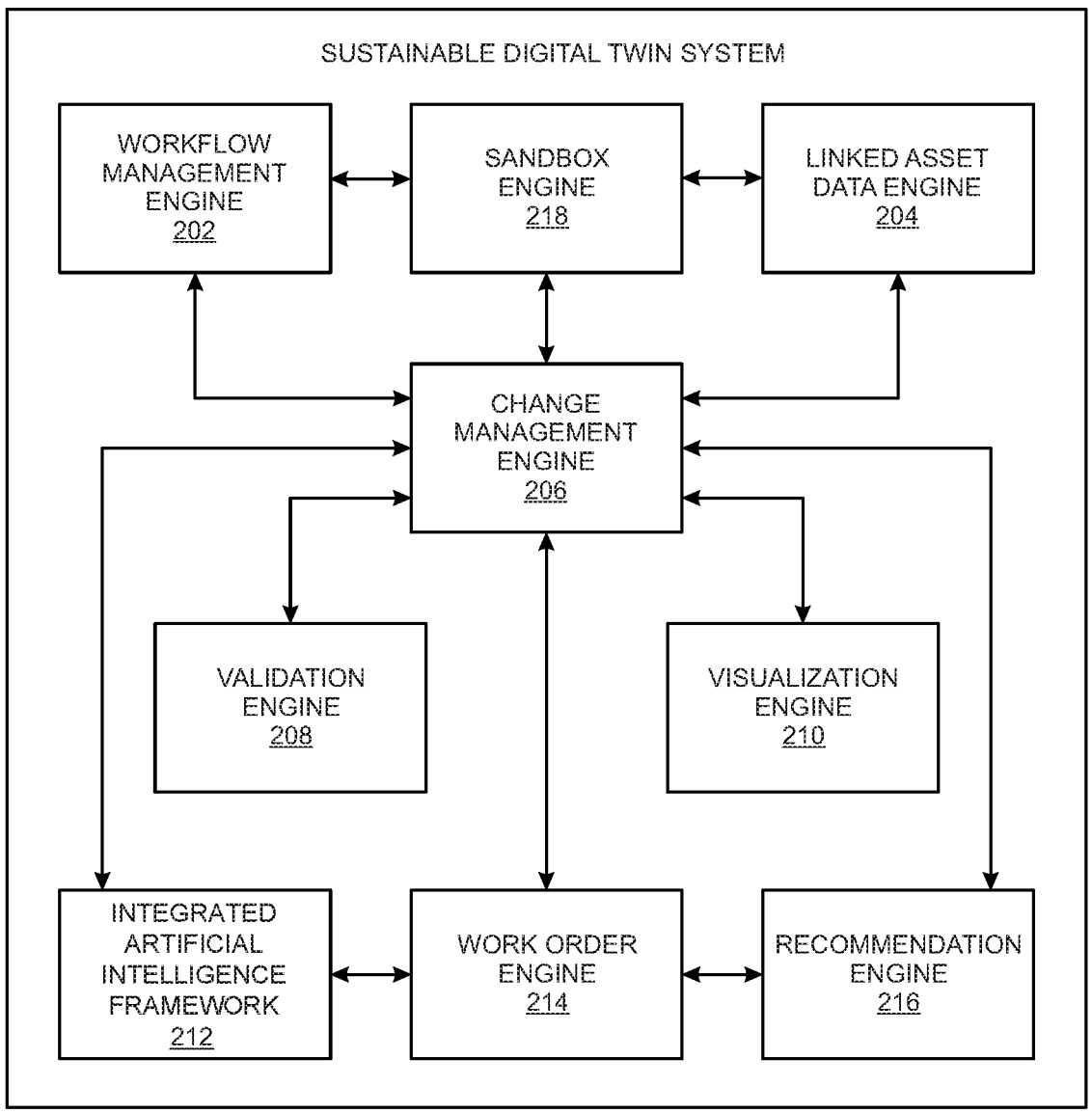
FIG. 2A is a block diagram illustrating a sustainable digital twin system, according to an exemplary embodiment.

FIG. 2A is a block diagram illustrating a sustainable digital twin system, according to an exemplary embodiment. FIG. 2A is described in conjunction with FIG. 1. With reference to FIG. 2, there is shown a sustainable digital twin system 200A. In an embodiment, the sustainable digital twin system 200A may include communicatively coupled arrangement of multiple engines, models, decision logic, circuitries, code executed by the circuitries, etc. For example, the sustainable digital twin system 200A may include a workflow management engine 202, a linked asset data engine 204, a change management engine 206, a validation engine 208, a visualization engine 210 an integrated artificial intelligence framework 212, a work order engine 214, a recommendation engine 216, and a sandbox engine 218. The aforementioned engines (e.g., 202, 204, 206, 208, 210, 212, 214, 216 and 218) may execute operations independently or in cooperation to enable the execution of specific tasks or functions. In an embodiment, the sustainable digital twin system 200A may enable seamless and uninterrupted monitoring and managing operations or functions in the facility.

In an embodiment, the virtual assets 106 may include one or more links to other virtual assets and an associated linked asset data that may be managed. The sustainable digital twin system 200A may enable modeling the physical assets 102 into a corresponding 3D virtual model and be represented by a corresponding virtual asset 106. Each virtual asset (e.g., 106) in the facility may be associated with information or data related to multiple attributes such as a linked asset data, a linked asset data mapping information, a graphical presentation, etc. Each attribute may further include a corresponding set of properties or parameters and identifiers that may enable tracking and managing the virtual assets 106 by the sustainable digital twin system 200A.

In an embodiment, the change management engine 206 may cooperatively work with other engines (e.g., 202, 204, 208, 210, 212, 214, 216 and 218) of the sustainable digital twin system 200A to execute specific operations or tasks. The change management engine 206 may implement the mechanism, for example, the management of change (MoC) mechanism that may enable monitoring and tracking modifications of the virtual assets 106 in real time. For example, such modifications may include, for example, an addition and/or a deletion of the virtual assets 106 in response to the addition and/or the deletion of the corresponding physical assets, modifications of the attributes, the graphical presentation, linked asset data, etc., associated with each virtual asset (e.g., 106), modifications in linked data between the virtual assets 106, modifications or updates of data links between the virtual assets 106, etc.

In an embodiment, the MoC mechanism implemented by the change management engine 206 may enable disaggregating the modifications of the virtual assets 106. The modifications implemented on the virtual assets 106 may be disaggregated thereby enabling certainty of the virtual assets 106. For instance, consider a scenario where only certain properties or parameters or attributes of the virtual assets 106 may need to be modified. In such a scenario, the other properties or parameters or attributes of the virtual assets 106 may be disaggregated from such modifications. For example, consider a virtual asset A that may be associated with the attributes, such as a visual appearance, the linked asset data, the graphical presentation, etc. When the end user executes operations to modify or change the visual appearance of the virtual asset A, the other attributes, such as the linked asset data, the graphical presentation, etc., may remain unaffected by the modifications as the MoC mechanism may enable disaggregating the modifications or changes performed to the visual appearance of the virtual asset A.

In an embodiment, such disaggregation of propagation of the modifications to the virtual assets 106 and may provision the end users to operate or work on lower-level details of the virtual assets 106. The modifications of the virtual assets 106 may be simulated and analyzed that may include, for example, the impact of such modifications on attributes like an impact on performance of the virtual assets 106. In an embodiment, the sustainable digital twin system 200A may enable independent modification of a 3D model's graphical presentation without affecting the data linked to the virtual assets 106. The technical feature that enables users to perform independent modification may provision the end users to upgrade or enhance the visual appearance of the virtual assets 106 without compromising the integrity of the existing data. In an embodiment, users may initially create low-level (less-detailed) 3D models corresponding to the virtual assets 106 and upgrade them with more detailed graphics in the future. For example, the upgrades may be performed when it is more cost-effective or when computer hardware performance can manage more complex 3D models. In an embodiment, the sustainable digital twin system 200A may provision a flexible and adaptable system that provides users with the freedom to evolve their digital twin assets over time, without requiring expensive and time-consuming data migrations.

In an embodiment, the work order engine 214 may cooperatively execute operations with the change management engine 206, and the sandbox engine 218 to enable simulating the modifications of the virtual assets 106. The sandbox engine 218 may provide a sandbox environment that may also be referred to as a work-in-progress environment. The modifications of the virtual assets 106 may be simulated in the sandbox environment. The sandbox environment may provision exporting complete or parts of the virtual assets 106 and simulate the proposed modifications by cooperatively working with change management engine 206. The sandbox environment may enable implementing modifications by executing various functions or tasks. For example, such tasks may include implementing proposed modifications of the virtual assets 106 and analyzing the impact of the modifications on the modified virtual asset and the other virtual assets 106. Such analysis may enable visualizing or validating an impact on the linked asset data, whether the virtual asset was modified partially or completely, whether the attributes of the modified virtual asset and other linked asset data were impacted, fine-tuning, or reversing the modifications, analyzing the impact on quality and consistency of the data, etc.

In an embodiment, an administrator or a manager or an assigned user may be able to analyze and simulate the modifications to understand the impact and the subsequent functioning of the virtual assets 106 in the facility. Upon performing such an analysis, the modifications may be accepted and implemented in real time such that the modifications are reflected in a production environment. The change management engine 206 may be configured to execute operations to continuously track the virtual assets 106 for updates, upgrades, or modifications of the virtual assets 106.

In an embodiment, the change management engine 206 may cooperatively execute operations with the workflow management engine 202 and the work order engine 214. For instance, the workflow management engine 202 may enable administrators or managers of the sustainable digital twin system 200A to author, initiate, and manage workflows. Such workflows may correspond to updates or upgrades or modifications of processes in the facility that may be defined, initiated, and assigned to specific users for implementing the executing the workflows. In certain scenarios, the workflows may be modified in real time, based on the requirements that may be monitored, tracked, and managed via the workflow management engine 202. Further, the change management engine 206 may cooperatively execute operations with the workflow management engine 202 to track the modifications in the processes, the modifications of the attributes of the virtual assets 106, and/or workflows and enable either propagating or disaggregating the modifications to the corresponding virtual assets 106.

In an embodiment, the work order engine 214 may enable creating work orders for initiating the modifications of the virtual assets 106. The work order engine 214 may enable creating work orders that may include one or more tasks for performing the modifications of the virtual assets. The workflow management engine 202 may execute operations in cooperation with the work order engine 214 via the change management engine 206 for creating and managing modifications in the workflows. In an embodiment, the sandbox engine 218 may execute operations and enable analysis of the impact of such modifications in the sandbox environment. Upon performing such analysis, operations such as reviewing and updating the modifications may be executed to propagate the modifications to the production view or production environment.

In an embodiment, the administrator or manager of the sustainable digital twin system 200A may be able to define and manage workflows that may be implemented by the sustainable digital twin system 200A. Defining and managing workflows may include defining work orders, defining specific scope of the tasks in the workorders, assigning the tasks and/or work orders to specific users, etc. Based on a type of facility or an entity, the workflow management engine 202 may enable customizing workflows or workorders based on the requirements or objectives of the facility or the entity. The sustainable digital twin system 200A may enable the end users to visualize an execution of the workorder and corresponding tasks that may be used to define the workflow. In an embodiment, based on user roles, the administrator or manager of the sustainable digital twin system 200A may be able to define work scope for each task and assign them to specific users.

In an embodiment, customizing workflows or workorders may include modifying specific data type associated with the virtual assets 106, executing certain operations based on validation rules, etc. The validation rules may correspond to the parameters or attributes associated with the virtual assets 106, validation rules associated with data validation or data normalization, etc. The workflow management engine 202 may execute operations in cooperation with the validation engine 208 to execute such the validations. Such validation rules may enable the data modifications to be consistent and be reviewed and approved before propagating to the production environments. In an embodiment, upon propagation of the modifications to the production environments, a unique production version number may be assigned. The change management engine 206 may execute operations to compare different production versions by referring to the unique production version number to analyze the modifications.

In an embodiment, the manager or administrator of the sustainable digital twin system 200A may define a type of data, the parameters, or the attributes that may be modified in different scenarios. For instance, the manager or administrator of the sustainable digital twin system 200A may define validation rules that only certain type of data or the parameters or the attributes may be changed in the sandbox environment. Further, the manager or administrator may define the validation rules such that certain type of data or the parameters or the attributes may be modified only in production environment. In an embodiment, the sustainable digital twin manager may enable distinct levels of authorizations based on type of user accounts or type of user roles. For example, end users with only certain level of authorizations may be able to view modifications to the virtual assets 106 performed in response to the execution of the work order or the tasks associated with the work order. The modifications may include information on what type or kind of modifications were affected or made, timestamp information and the end user who performed the modification.

In an embodiment, the change management engine 206 in cooperation with the linked asset data engine 204 may execute operations to enable analyzing linked asset data associated with the virtual assets 106. Such analysis may enable the manager or administrator of the sustainable digital twin system 200A to review modifications or changes in the parameters or the attributes associated with the virtual assets 106, review modifications of changes of the affected linked asset data and manage the propagations of such modifications across all linked virtual assets 106 and third-party systems. In an embodiment, the change management engine 206 may execute operations to enable enhancing the virtual assets 106 by disaggregating the modifications to be propagated to the attributes related to the linked asset data and the graphical presentation of the virtual assets 106. Such enhancement of the virtual assets 106 may enable increasing the sustainability of the virtual assets 106 and provision changing the visual representation of the virtual assets 106, by disaggregating the impact on the linked asset data.

In an embodiment, the change management engine 206 in cooperation and the recommendation engine 216 may execute operations to analyze the modifications and provide a checklist of recommendations or suggestions to the end users. The checklist of recommendations or suggestions may include information related to accuracy and consistency of the linked asset data and other attributes or data associated with the virtual assets 106. The integrated artificial intelligence framework 212 may be trained with real time data in the facility. Further, whenever there are modifications in the data, the change management engine 206 in cooperation with the machine learning engine 212 and the recommendation engine 216 may provide insights via suggestions or recommendations and enable the end users to review the modifications and the data is consistent between the virtual assets. In an embodiment, the change management engine 206 in cooperation with the recommendation engine 216 may execute operations to send notifications to the end user based on predefined rules. For example, such predefined rules may be associated with monitoring the modifications or changes in the asset data. The predefined rules may monitor the modifications in the linked asset data and ensure that the linked asset data modifications are compliant in terms of security and certainty.

In an embodiment, the management of change (MoC) mechanism may provide a structure with a defined and controlled process for making modifications to the virtual assets. The MoC mechanism may enable pre-defining work orders and tasks for various scenarios to assist users to update their digital twin assets. The end users may predefine work order and tasks that may correspond to adding, removing, modifying, and updating digital twin assets. In another embodiment, the end users may create custom work orders and tasks.

For example, the predefined rules may enable validating work order templates and ensure certainty and consistency of assets when adding new assets to the existing digital twin.

Example 1: Incorporate a New Physical Data Asset into Existing Facility Setup and Ensure Consistency with the Inspection System Consider a scenario where a new physical data asset is incorporated into an existing model that needs to be consistent with existing assets and also ensure consistency with the inspection system. Now let us consider a scenario where a facility includes multiple operational units. Each unit may include digital asset models that may include part of the facility. Now let us consider that the facility manager may decide to extend the model by adding an additional unit. In such a scenario, the facility may be rescanned to accommodate the addition of a new unit. In such a scenario, a laser scanning team may visit the facility and return with new physical data. Now let us consider that model is integrated with an inspection system, marked points in measurement locations in the inspection system, and these systems must be kept synchronized.

In such an above-described scenario, the work order template may include the following tasks:

Import physical data: Import registered scans, import survey data, transform coordinates, define a region grid, create a model hierarchy, and create primitives.

Modeling: Scan the imported physical data and generate a 3D model including digital twin assets corresponding to the physical data and perform a quality check to verify the results.

Intelligence: Asset intelligence corresponding to each digital asset may be added. For example, the asset intelligence may include asset names and properties, import P&IDs, and store data in the asset workspace. Further tasks may include creating additional workspaces, deploying assets to the new workspaces, and note discrepancies between P&IDs and the asset workspace.

Update inspection data: Synchronize the inspection workspace with the inspection system.

Update Knowledge Views: Update knowledge views used in inspection.

In an embodiment, predefined rules may be applied, and the sustainable digital twin system may provide recommendations including checklists to verify the affected changes if any.

Example 2: Decommission or Removing an Asset

Consider a scenario where an asset such as a distillation tower is shut down and demolished. In such a scenario, there may be no new design models or physical data, a minor amount of modeling may be needed at the boundaries of the demolished asset. In an embodiment, the modeled facility including 3D digital models may be integrated with the inspection management system.

In such an above-described scenario, the work order template may include the following tasks:

Modeling: Remove the demolished assets and update adjacent assets, as necessary. The demolished assets appeared in multiple workspaces and confirmed that the demolished assets were removed.

Update inspection data: Synchronize the inspection workspace with the inspection system. Remove inspection points that may be associated with the demolished asset.

Update Knowledge Views: Review knowledge views that may previously include the demolished asset to ensure that they have been updated correctly.

In an embodiment, predefined rules may be applied, and the sustainable digital twin system may provide recommendations including checklists to verify the affected changes if any.

In an embodiment, tasks made additionally include a checklist. For instance, a task to update knowledge views may include a checklist with an entry for each knowledge view to update. If a task is configured with a checklist, the sustainable digital twin system may generate the checklist when the task is activated, based on a predefined rule in the work order template.

Example 1: Consider a scenario where there is a task to import a model and update knowledge views. When the work order including the model import task is completed and the asset workspace has been updated, the sustainable digital twin system may determine which knowledge views may be affected and creates an entry in the second task's checklist for each affected knowledge view.

Example 2: Consider a scenario where there is a task of decommissioning assets. The work order may include the task to remove decommissioned assets from all workspaces and knowledge views. When the sustainable digital twin system activates the task, a predefined rule may be executed that may generate a checklist displaying information corresponding to the assets of the 3D digital model.

In an embodiment, the change management engine 206 in cooperation with the validation engine 208 may execute operations to implement certain validations based on the validation rules. For example, when the virtual assets 106 are modified, the validation engine 208 may execute operations to implement the validation rules to perform the validations. For example, the validation rules may be associated with validating attributes associated with the virtual assets 106, validating linked asset data, and validating data consistency and/or the virtual assets 106 certainty. In an embodiment, the validation engine 206 may execute operations to implement the validation rules such that only certain type of data or the parameters or the attributes may be changed in the sandbox environment. Upon successfully executing operations for the validations, the validation engine 208 in cooperation with the change management engine 206 and the visualization engine 210 may provide insights into the modifications and the impact of the modifications on the virtual assets.

In an embodiment, the change management engine 206 in cooperation with the visualization engine 210 may generate graphical visualizations that may be displayed on a user interface or a dashboard. The graphical visualizations may include information associated with the attributes of the virtual assets 106, the linked asset data, the graphical presentation, etc. In an embodiment, the graphical visualizations may provide insights of the modifications to the virtual assets 106, modifications of the virtual assets 106 in different scenarios and/or production environments, the change history associated with the virtual assets 106, etc.

Figure 2B:
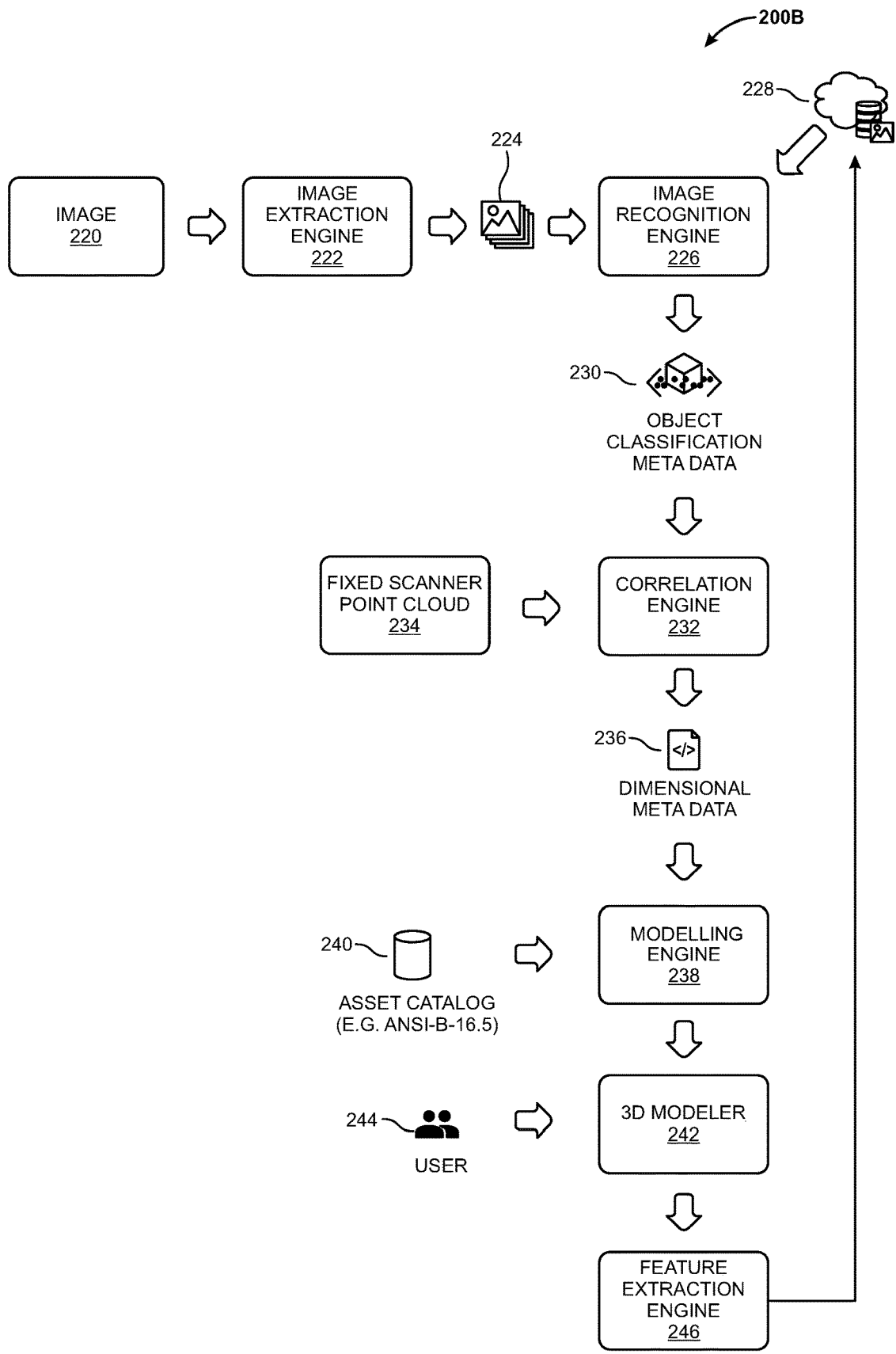
FIG. 2B is a block diagram illustrating an integrated artificial intelligence framework, according to an exemplary embodiment.

FIG. 2B is a block diagram illustrating an integrated artificial intelligence framework, according to an exemplary embodiment. FIG. 2B is described in conjunction with FIG. 1 and FIG. 2A. With reference to FIG. 2B, there is shown an environment 200B that may include engines, models, circuits, etc., that may be implemented as machine learning engines in the integrated artificial intelligence framework 212. In an embodiment, the integrated artificial intelligence framework 212 may include an image extraction engine 222, an image recognition engine 226, an image correlation engine 232, a modelling engine 238, a 3D modeler 242, and a feature extraction engine 246. The above-described engines, models, circuits, etc., may execute operations independently or in cooperation to achieve specific outcomes or execute specific functions or operations.

In an embodiment, the sustainable digital twin system 200A may implement an execution of the integrated artificial intelligence framework 212 to enable or ascertain asset certainty in the facility. The integrated artificial intelligence framework may provision or implement a mechanism that may classify objects (e.g., physical assets in the facility) via a point cloud and image recognition techniques. A fixed scanner (e.g., 234) may produce point clouds that may include a 2-dimensional (2D) matrix with rows and columns of 3-dimensional (3D) vertices including photographic images. In an embodiment, the function or operation to classify a set of vertices within the point cloud may implement an image recognition mechanism to identify objects (e.g., a flange) at a certain location in the facility. The scanner orientation and distance to vertex may correlate image "pixels" to point cloud vertices.

Referring to FIG. 2B, the image extraction engine 222 may receive images (e.g., 220) and execute operations to extract multiple projected images (e.g., 224) from the point cloud data. The multiple projected images (e.g., 224) may be extracted and provided to the image recognition engine 226. In an embodiment, the image recognition engine 226 may be implemented as a machine learning engine that may receive the multiple projected images (e.g., 224) as input. The image recognition engine 226 may further receive additional meta data from an external data source (e.g., 228). The additional meta data may include data or information of the facility including type of facility (e.g., power, petrochemical, etc.). The image recognition engine 226 may use the meta data from the external data source for improving detection of object (e.g., physical assets) recognition. The image recognition engine 226 may use the classification of metadata (e.g., object classification meta data 230) that may include asset classification information and the position in the image where the specific asset may be located.

In an embodiment, the image correlation engine 232 may receive inputs of the object classification meta data 230 and from the fixed scanner point cloud 234. The image correlation engine 232 may execute operation to correlate rows and columns of image pixels to rows and columns of the point cloud data mapping image pixels to point cloud 3D vertices (XYZ). The image correlation engine 232 may implement an execution of the mathematical functions. An object recognized on the projected image may map to a collection of 3D vertices. The dimensional meta data (e.g., position, size, etc. 238) and the asset classification may be extracted from the 3D vertices that may be provided to the modelling engine 238.

In an embodiment, the modelling engine 238 may execute operations and generate a partially classified 3D model. The partially classified 3D model may include point cloud generated mesh data and higher-level classified assets. The modelling engine 238 may receive additional data (e.g., asset catalog 240, ANSI-B-16.5) that may be used for generating the partially classified 3D model. In an embodiment, the 3D modeler may provision a platform for the user (e.g., 244) to interact with the 3D model. The 3D modeler may be implemented as an asset modeler application that may further enable classifying point cloud generated mesh, thereby providing higher level of asset certainty.

In an embodiment, the feature extraction engine 246 may implement an execution of operations or functions to extract images from the 3D model based on user classified asset information. The 3D modeler may enable the user classified assets as well as the projected images produced by the image extraction engine 222 may produce additional image meta data that may be used by the image recognition engine 226.

In an embodiment, the integrated artificial intelligence framework 212 may be trained continually based on information corresponding to the physical assets or physical objects. The integrated artificial intelligence framework 212 may be trained based on granular level information including data associated with the physical assets. Such granularity may enable implementing measures that may enable in reducing operational costs, improving efficiency of the facility, and effectively implement sustainability efforts for managing the operations of the facility. In an embodiment, the integrated artificial intelligence framework 212 may enable execution of operations in cooperation with the change management engine 206 thereby assuring asset certainty.

Figure 3:
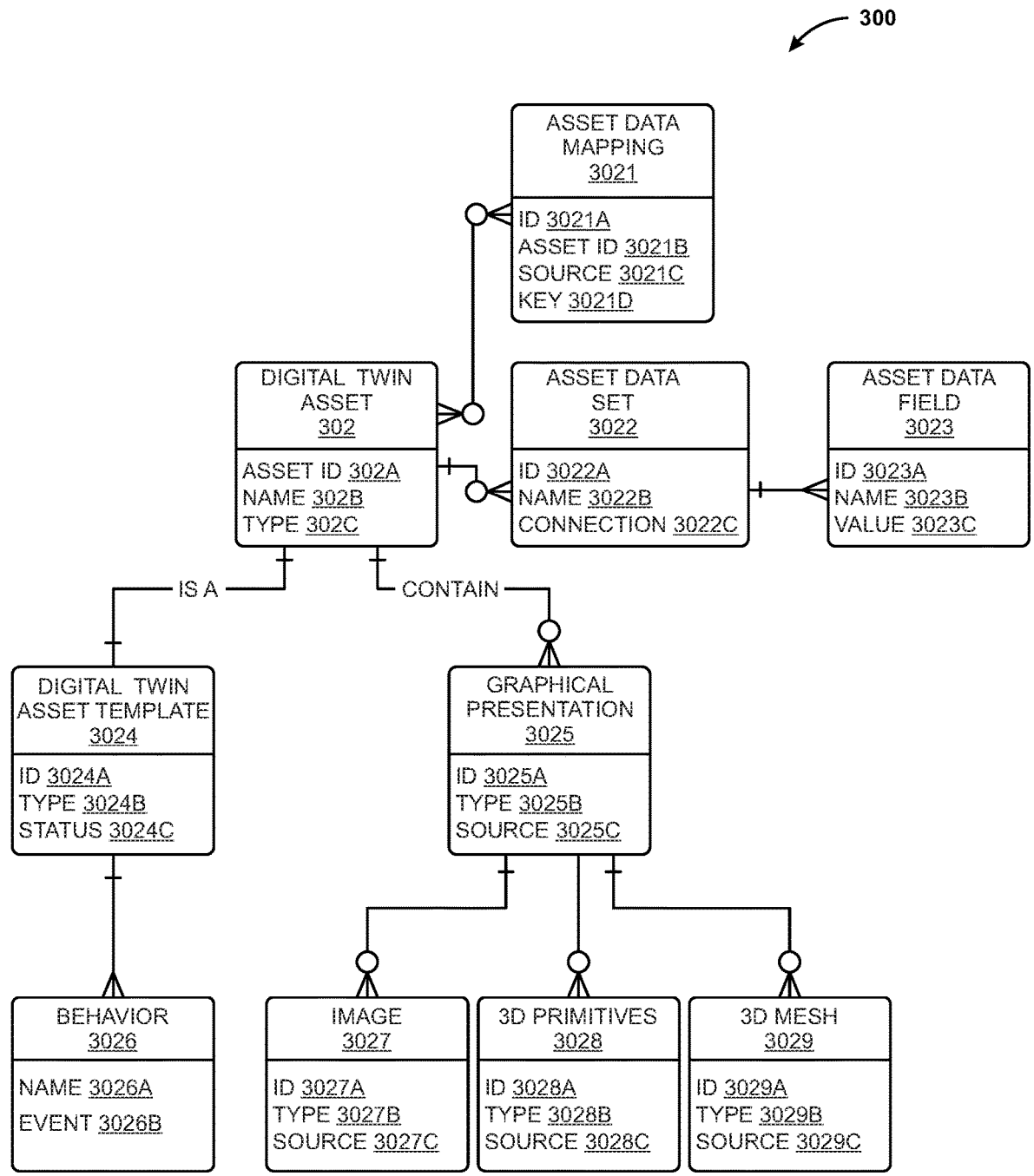
FIG. 3 is a block diagram illustrating attributes associated with the digital twin asset, according to an exemplary embodiment.

FIG. 3 is a block diagram illustrating attributes associated with the digital twin asset according to an exemplary embodiment. FIG. 3 is described in conjunction with FIG. 1 and FIGS. 2A and 2B. With reference to FIG. 3, there is shown an illustration that includes attributes associated with the digital twin assets or the virtual assets 106. In an embodiment, a digital twin asset 302 may correspond to and represent the virtual asset and may be associated with attributes such as Asset ID 302A, Name 302B, and Type 302C. Further, the digital twin asset 302 may include attributes such as a graphical presentation 3025 and an associated attributes' such as ID 3025A, type 3025B and source 3025C. Further the digital twin asset 302 may include a digital twin asset template 3024 and an associated attributes' such as an ID 3024A, a type 3024B, and a status 3024C. In an embodiment, the graphical presentation 3025 may include an image 3027 and associated attributes ID 3027A, a type 3027B and a source 3027C; 3D primitives 3028 and an associated attributes such as an ID 3028A, a type 3028B and a source 3028C; and a 3D Mesh 3029 and associated attributes such as an ID 3029A, a type 3029B and a source 3029C.

In an embodiment, the digital twin asset template 3024 (e.g., virtual asset template) may be associated with, for example, a behavior 3026 and an associated attributes namely name 3026A and event 3026B. The digital twin asset 302 may be associated with an asset data set (e.g., linked asset data) and an associated attributes namely an ID 3025A, name 3022B and connection 3022C and an asset data field 3023 and corresponding attributes namely an ID 3023A, a name 3023B and a value 3023C. Each digital twin asset 302 may further include information related to an asset data mapping 3021 and associated attributes namely an ID 3021A, an Asset ID 3021B, a source 3021C and a key 3021D. In an embodiment, the digital twin asset 302 or virtual assets 106 may be configured not to lose the data connectivity to the existing linked asset data or information, when the virtual assets 106 are modified or updated. Such linked asset data information may include historical data and/or real time data. The virtual assets 106 may manage the graphical presentation (e.g., 3025) independently and may provide flexibility to update the graphical presentation (e.g., 3025) associated with other virtual assets without impacting or affecting the existing linked asset data and the corresponding associated attributes.

In an embodiment, the cooperative working of the change management engine 206 with the other engines (e.g., 202, 204, 208, 210, 212, 214, 216, and 218) may simplify managing and maintaining the sustainable digital twin system 200A. Further, the change management engine 206 may execute operations to track the modifications at asset level that may enhance or increase the certainty and behavior of each virtual asset. Further, the administrator or manager of the sustainable digital twin system 200A may be provisioned with a simplified interface for creating and assigning tasks or workorders to specific users. The interface may further enable the administrator or manager to control and accept or reject the modifications of the virtual assets 106. The cooperative working of the change management engine 206 with the work order engine 214 and the visualization engine 210 may provision simulating and visualizing modifications before accepting and publishing the modifications to be reflected into the production environment. Such simulation and real time visualization may facilitate eliminating the operational downtime of the facility and/or the physical objects or the physical assets 102 in the facility and may optimally validate the data consistency associated with the virtual assets 106 of the facility. In an embodiment, the virtual assets 106 may be modeled based on a replica representation of the corresponding physical assets 104 of the facility that may ascertain that the 3D virtual models or the virtual assets 106. Such replication may eliminate errors that may occur due to omissions or overlooking in the facility.

Figure 4A:
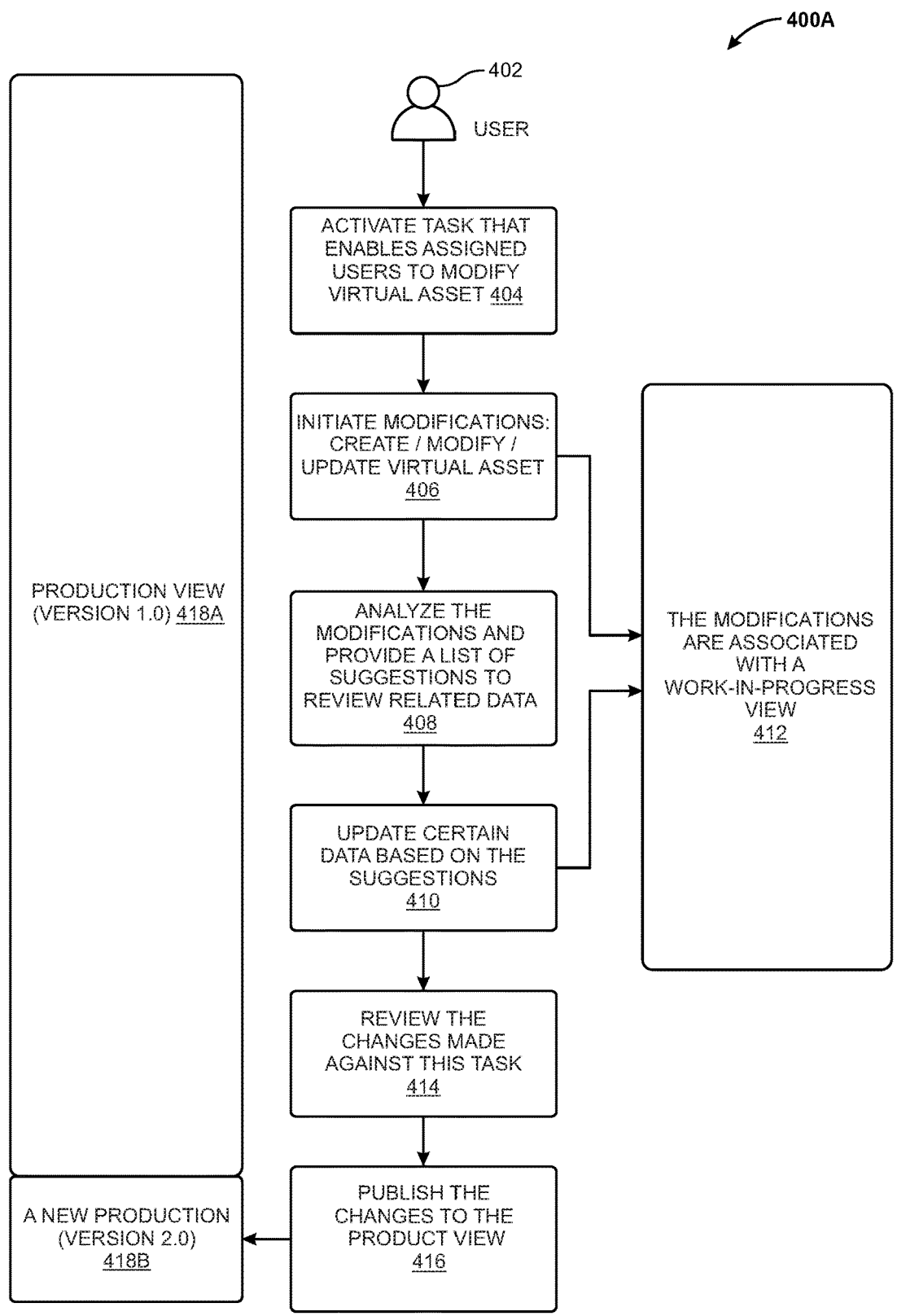
FIG. 4A is a block diagram illustrating a workflow implementing a mechanism of management of change using the sustainable digital twin system, according to an exemplary embodiment.

FIG. 4A is a block diagram illustrating a workflow implementing a mechanism of management of change in the sustainable digital twin system, according to an exemplary embodiment. FIG. 4A is described in conjunction with FIG. 1, FIGS. 2A, 2B and FIG. 3. With reference to FIG. 4A, there is shown a workflow 400A implementing the mechanism of MoC using the sustainable digital twin system 200A in a facility. The workflow 400 may include a sequence of steps, as shown and described in FIG. 4A as an exemplary embodiment. In an embodiment, the sustainable digital twin system 200A may provision a platform where a user 402 for example, the administrator or the manager of sustainable digital twin system 200A may create and activate a task that enables assigned users to modify the virtual asset 404 based on the work order and the tasks. The created tasks may be assigned to specific user(s) and may include execution of operations, for example, to perform modifications (e.g., initiate modifications: create/modify/update virtual asset 406) of the virtual assets 106. For instance, performing such modifications or changes may include defining and initiating modifications, such as creating, modifying, updating, etc., of the virtual assets 106.

In an embodiment, upon detecting the modifications, the sustainable digital twin system 200A may analyze the modifications. As described in detailed description of FIG. 2, the change management engine 216 may work in cooperation with the other engines (e.g., 202, 204, 208, 210, 212, 214, and 216) of the sustainable digital twin system 200A to execute specific operations or tasks. The sustainable digital twin system 200A may analyze the modifications and provide recommendations or suggestions to review the related data 408. For instance, the sustainable digital twin system 200A may generate a user interface or dashboard to review the modifications. For example, such recommendations or suggestions may be related to the modifications of the virtual assets 106, impact of the modifications on the linked asset data, etc. In an embodiment, the data, and associated attributes with the virtual assets 106 are as shown and described with reference to FIG. 3.

In an embodiment, the assigned users may be enabled to review the suggestions or the recommendations (e.g., review the changes made against this task 414) and execute certain operations on the data. For example, the assigned users may be able to modify, add, delete, or update the data (e.g., update certain data based on the suggestions 410) based on the suggested recommendations or suggestions. In an embodiment, the modifications that may be accepted and implemented may be displayed as modifications with a work-in-progress environment (e.g., the modifications are associated with a work-in-progress view 412). Further, upon implementing the modifications, the manager of sustainable digital twin system 200A and/or the assigned users may be able to review the modifications based on the corresponding tasks and/or the workorders that were initially created. In an embodiment, the modifications may be published (e.g., 416 publish the changes to the production view) by the sustainable digital twin system 200A that may be reflected with a corresponding new version number (e.g., 418A, 418B) in the production environment.

In an embodiment, the sustainable digital twin system 200A may provision managing the virtual assets remotely. For example, the sustainable digital twin system 200A may provision remotely authoring or updating the virtual assets 106 by third parties. The administrator or manager of the sustainable digital twin system 200A may be able define a scope and provide access control to the third-party vendors for modifying the virtual assets 106. In an embodiment, the sustainable digital twin system 200A may also provision or facilitate exporting certain parts of the virtual assets 106 and execute specific functions or tasks on these exported parts. Such a mechanism of partial exportation of the certain parts of the virtual assets 106 may eliminate the need of exporting the entire dataset or entire database of the virtual assets 106. Upon performing specific tasks including the modifications the certain exported parts of the virtual assets 106, the modified parts of the virtual assets 106 may automatically be merged back with the other parts of the virtual assets 106.

Figure 4B:
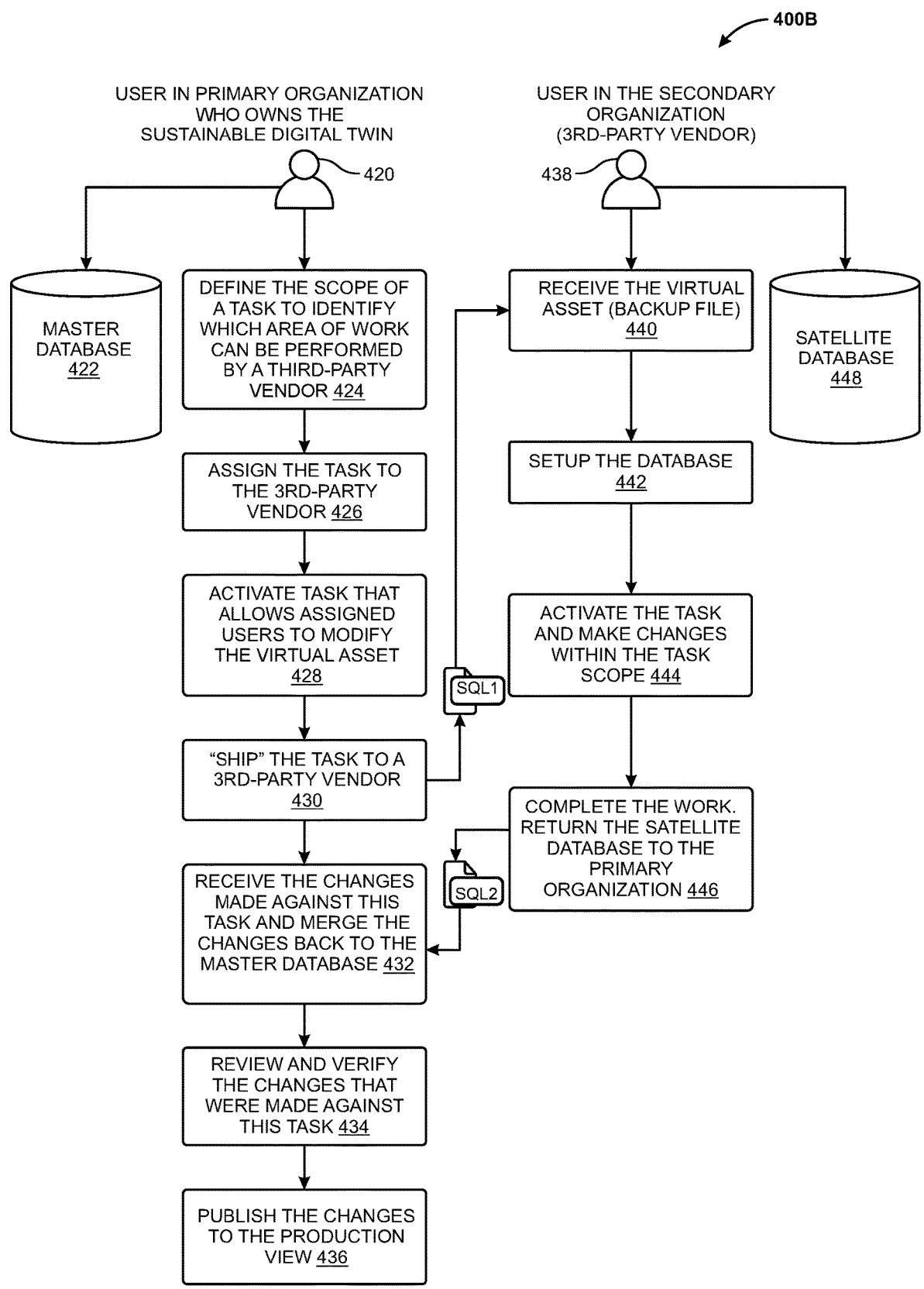
FIG. 4B is a block diagram illustrating a workflow implementing a mechanism sharing work between multiple organizations, according to an exemplary embodiment.

FIG. 4B is a block diagram illustrating a workflow implementing a mechanism sharing work between multiple organizations, according to an exemplary embodiment. FIG. 4B is described in conjunction with FIG. 1, FIG. 2A, FIG. 2B, FIG. 3, and FIG. 4A. With reference to FIG. 4B, there is shown a workflow mechanism 400B that enables sharing work between multiple organizations. As an exemplary embodiment, the workflow mechanism 400B shown and described with reference to FIG. 4B includes, for example, a primary organization and a secondary organization. In an embodiment, the secondary organization may be a third-party vendor. The user 420 in the primary organization who owns the sustainable digital twin system 200A may be enabled to share work with the third-party vendor via the workflow mechanism 400B. The work sharing between the primary organization may enable the third-party vendor to perform or execute tasks for modifying the virtual assets and other data that may be related to the virtual assets 106. The third- In an embodiment, the virtual assets 106 may be stored in the master database 422 of the primary organization. The sustainable digital twin system 200A may provision a platform where a user 420 for example, the administrator or the manager of sustainable digital twin system 200A may include the step 424 of define the scope of a task to identify which area of work can be performed by a third-party vendor (e.g., a secondary organization that is independent and outside the primary organization). The next step 426 may include assigning the task to the third-party vendor. Upon assignment, the next step 428 may include activating the task that allows assigned user to modify the virtual asset. The next step 430 may include sending (e.g., "SHIP") the task to the third-party vendor via an execution of a sequel query (e.g., SQL1) which may create a satellite database 448. The next step 442 may include user 438 loading the virtual asset to be modified from the satellite database into the sustainable digital twin system (e.g., setup the database 442). The next step 444 may include activating the task and making changes or modifications to the virtual asset within the task scope. The next step 446 may include completing the assigned task or work and return the modified virtual asset satellite database to the primary organization. In an embodiment, a sequel query (e.g., SQL2) may be executed for sending the modified virtual asset to the primary organization.

In an embodiment, the next step 432 may include receiving the changes or modifications made against the task and merge the changes back to the master database. The next step 434 may include reviewing and verifying the changes or modifications that were made against the task. The next step 436 may include publishing the changes made to the virtual assets 106 to the production environment or view. In an embodiment, the sustainable digital twin system 200A may enable that access and execution of the task by the third-party vendor or the secondary organization was limited to the scope it was assigned by only allowing the primary system to receive (import) changes that fall within the scope of the task.

In an embodiment, the sustainable digital twin system 200A as shown and described in FIG. 2 may enable the virtual assets 106 to retain the connectivity with the other virtual assets in the facility in real time. For instance, when certain attributes and/or parts of the virtual assets 106 are modified, the virtual asset under modification may continue to be connected with the other virtual assets 106 in real time, thereby eliminating any downtime. Further, the virtual assets 106 that may be undergoing modifications may have uninterrupted connectivity in real time including the associated historical data. In an embodiment, the sustainable digital twin system 200A may execute operations to provide notifications to the administrators or managers of the sustainable digital twin system 200A or assigned users based on the modifications to the virtual assets. Further, the sustainable digital twin system 200A may provision a dashboard to visually view the modifications of the virtual assets 106, perform further analysis and review them, before publishing the production environment. Further, the sustainable digital twin system 200A may provision reviewing historical modifications of the virtual assets 106 and analyze the impact of the modifications of the virtual assets 106 (e.g., the modified virtual assets and the linked asset data of the other virtual assets).

Figure 5:
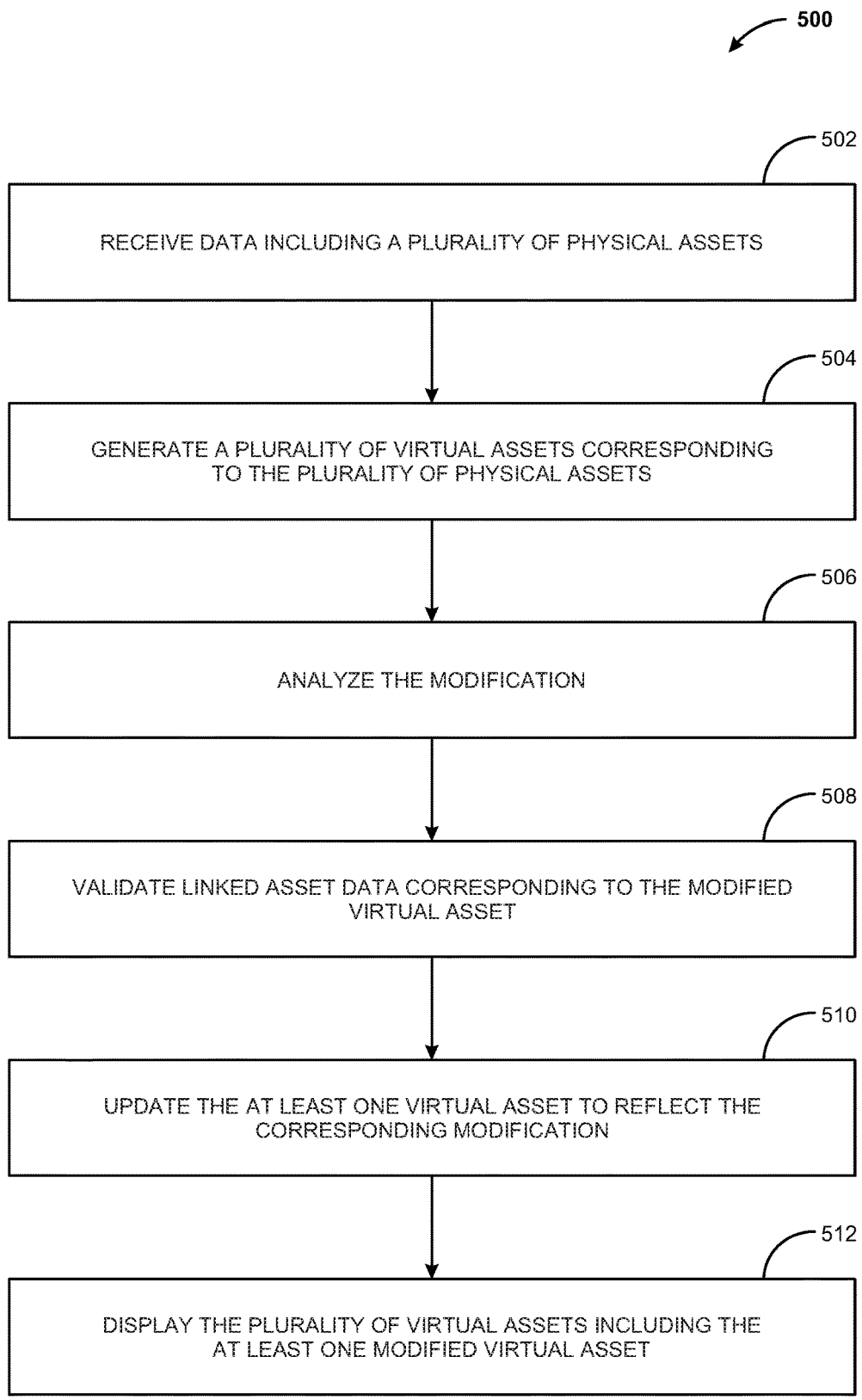
FIG. 5 is an illustration showing a flow diagram of a process for managing a virtual asset using a sustainable digital twin system, according to an exemplary embodiment.

FIG. 5 is an illustration showing a flow diagram of a process for managing a virtual asset using a sustainable digital twin system, according to an exemplary embodiment. FIG. 5 is described in conjunction with FIG. 1, FIG. 2, FIG. 3, and FIG. 4. At 502, data including multiple assets is received. At 504, multiple virtual assets corresponding to the multiple physical assets are generated. At 506, modifications of the virtual assets are analyzed. At 508, linked asset data corresponding to the modified virtual asset is validated. At 510, at least one virtual asset is updated to reflect the corresponding modification. At 512, the multiple virtual assets including the at least one modified virtual asset are displayed. The operational efficacies of the process 500 steps namely 502, 504, 506, 508, 510 and 512 are implemented by the sustainable digital twin system 200A, as shown, and described with reference to FIG. 2.

Figure 6A:
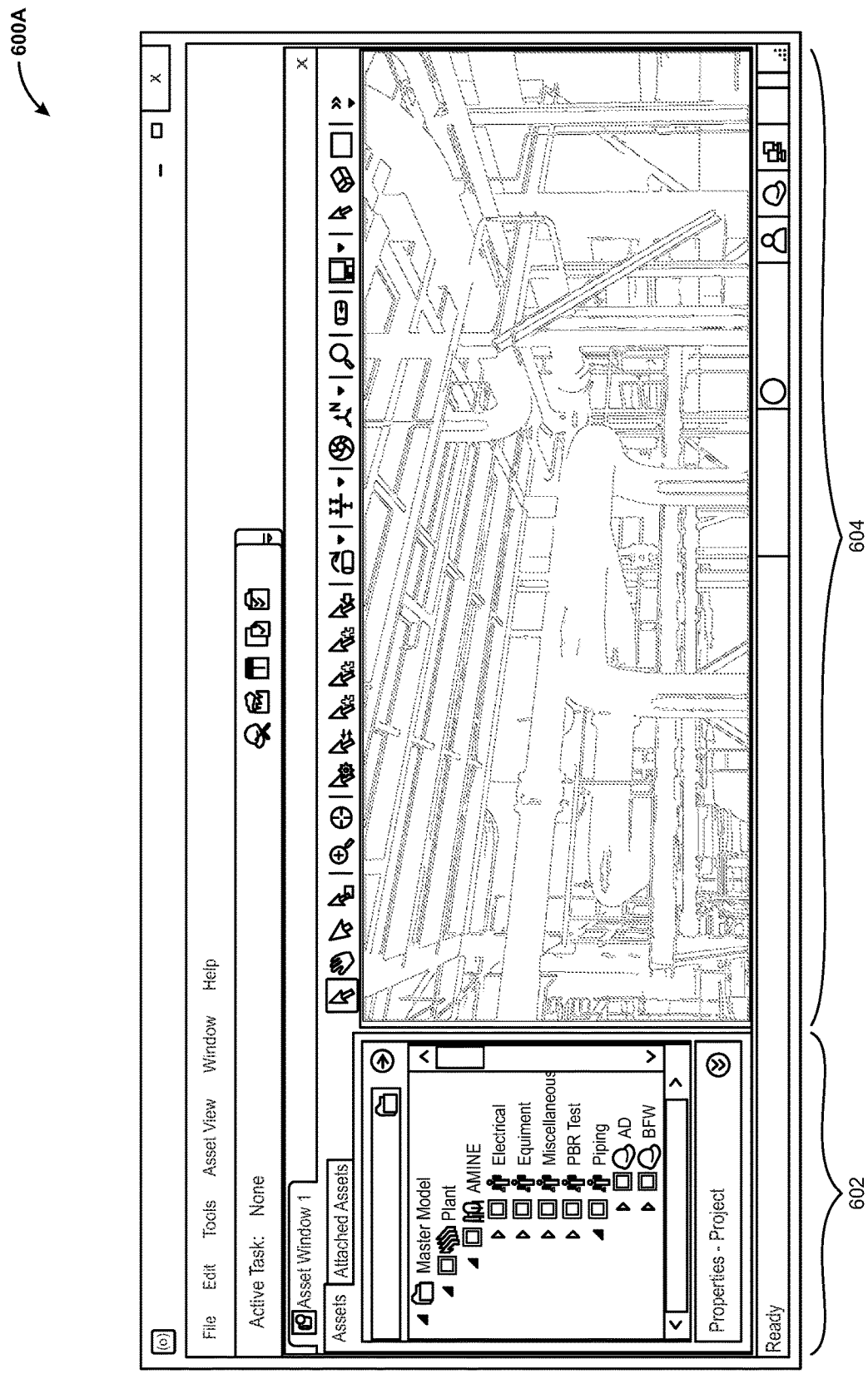
FIG. 6A is an illustration showing a dashboard that displays virtual assets in a facility, according to an exemplary embodiment.

FIG. 6A is an illustration showing a dashboard 600A that displays virtual assets in a facility, according to an exemplary embodiment. With reference to FIG. 6A, there is shown a dashboard 600A that displays the virtual assets. In an embodiment, the dashboard may be generated by the sustainable digital twin system 200A. The dashboard 600A may include multiple windows, for example, a virtual asset navigation window 602 and a main window 604 displaying the virtual assets. The main window 604 displaying the virtual assets may also show the modifications of the virtual assets in the facility. In an embodiment, the end user may perform analysis and review the modifications of the virtual assets before publishing them to the production view environment.

Figure 6B:
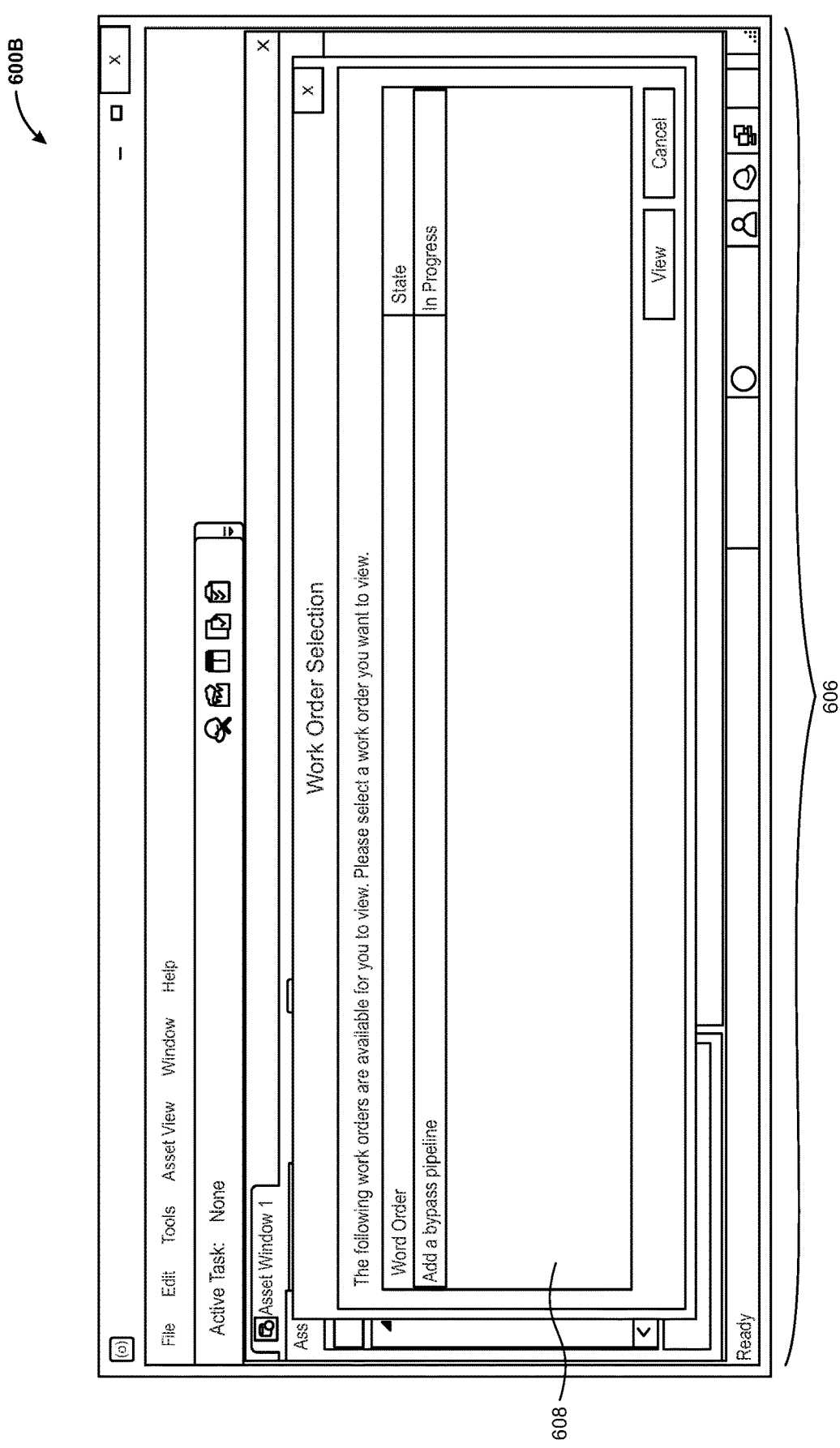
FIG. 6B is an illustration showing a dashboard that displays a work order including a task, according to an exemplary embodiment.

FIG. 6B is an illustration showing a dashboard 600B that displays a work order including a task, according to an exemplary embodiment. With reference to FIG. 6B, there is shown a dashboard 600B that may be generated by the sustainable digital twin system 200A. In an embodiment, the dashboard 600B may include a window 606 that may display a work order 608 (e.g., work order selection) including a task (e.g., add a bypass pipeline) in a work-in-progress environment. The dashboard 600B may display information corresponding to the changes that were made in the work-in-progress environment.

Figure 6C:
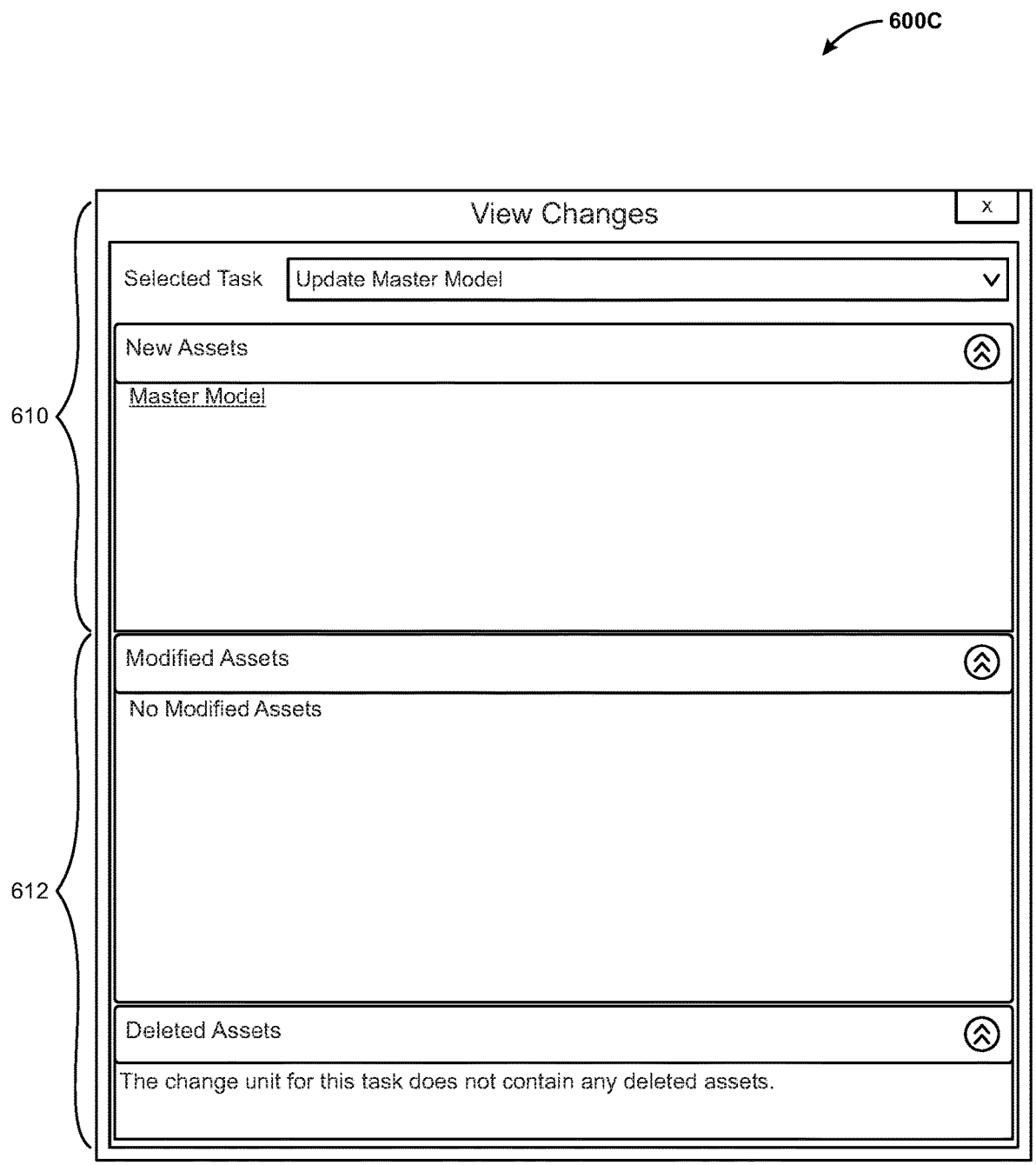
FIG. 6C is an illustration showing a dashboard displaying information associated with the virtual assets, according to an exemplary embodiment.

FIG. 6C is an illustration showing a dashboard 600C displaying information associated with the virtual assets, according to an exemplary embodiment. With reference to FIG. 6C, there is shown a dashboard 600C that may be generated by the sustainable digital twin system 200A. In an embodiment, the dashboard 600C may display information corresponding to the modified virtual assets in the facility. For example, 610 and 612 show information such as new assets, modified assets, deleted assets, master model, etc. In an embodiment, the dashboard 600C may enable the end user to select the task that the user performed to update virtual assets that may propel the sustainable digital twin system 200A to provide the virtual assets that have been added, modified, and deleted.

Figure 6D:
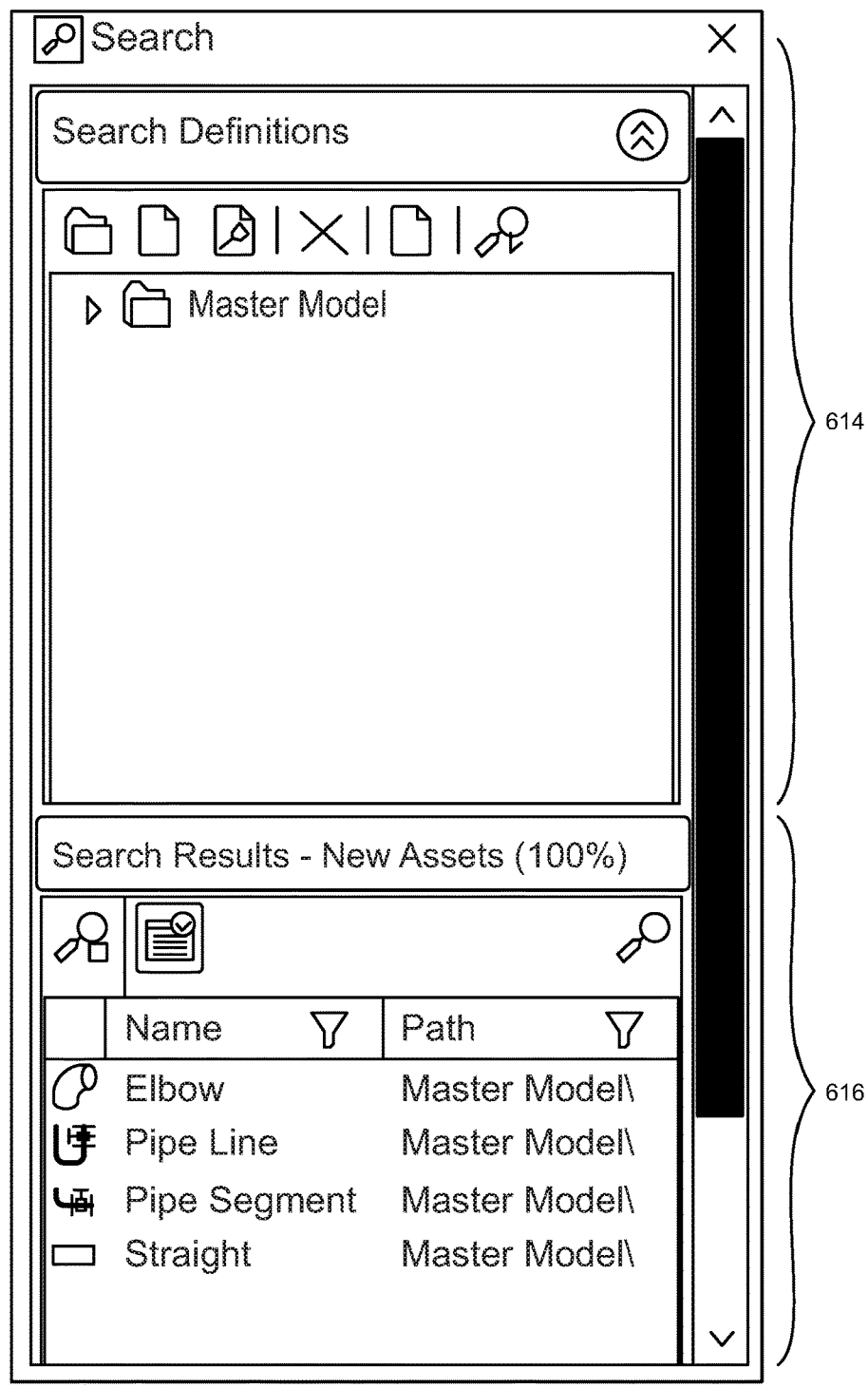
FIG. 6D is an illustration showing a dashboard displaying a list of assets, according to an exemplary embodiment.

FIG. 6D is an illustration showing a dashboard 600D displaying a list of assets, according to an exemplary embodiment. With reference to FIG. 6D, there is shown a dashboard 600D that may be generated by the sustainable digital twin system 200A. In an embodiment, the dashboard 600D may display a list of virtual assets that may be added to the work-in-progress environment. For example, 614 and 616 show information of a master model and new assets (new virtual assets) that may be added in work-in-progress environment.

Figure 6E:
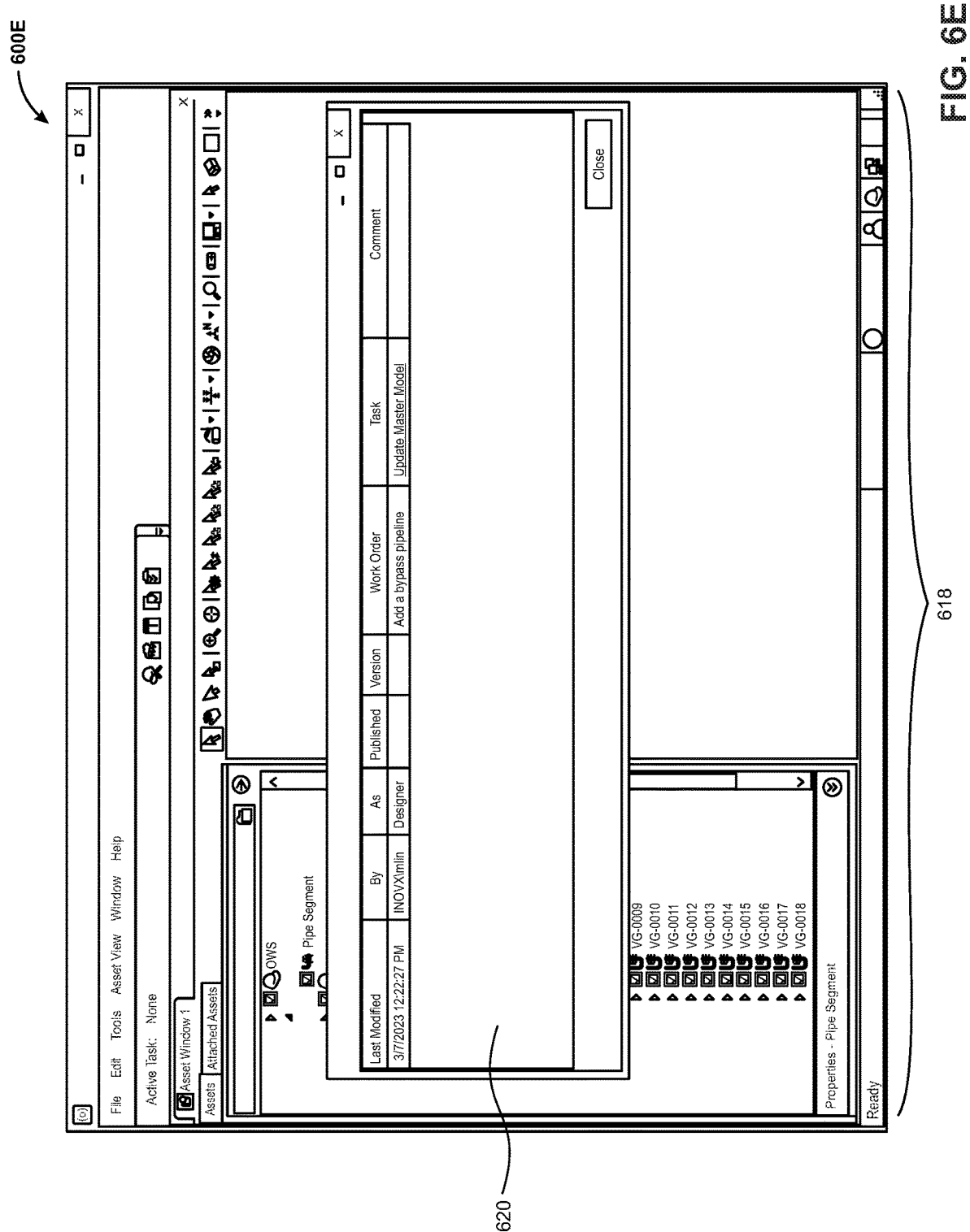
FIG. 6E is an illustration showing a dashboard 600D displaying information associated with historical modifications of the virtual assets, according to an exemplary embodiment.

FIG. 6E is an illustration showing a dashboard 600D displaying information associated with historical modifications of the virtual assets, according to an exemplary embodiment. With reference to FIG. 6E, there is shown a dashboard 600E that may be generated by the sustainable digital twin system 200A. In an embodiment, the dashboard 600E may display information that may include or be associated with historical modifications of the virtual assets. For example, 618 and 620 may correspondingly display the list of virtual assets and the historical modification information associated with the virtual assets.

In an embodiment, the sustainable digital twin system 200A may assign the levels of certainty to the digital assets, described:

TABLE 1

Enumerated Values of Asset Physical Accuracy

| Asset Certainty Level | Asset Physical Accuracy | |
|---|---|---|
| High | As Built | Represents the highest level of physical accuracy. The asset was digitally verified against or constructed from as-built point cloud data or photogrammetry. |
| Medium | As Designed | Represents an assumed level of accuracy. While it may be assumed that the asset is physically accurate, some deviations may occur caused by construction discrepancies. |
| Medium | Field Verified | Represents that the asset may be constructed or updated against a field (facility) verified drawing or sketch. While the virtual models may reflect an accurate representation of the assets within the physical facility, the physical (dimensional) information was obtained through manual methods where human error may be considered. |
| Low | As Observed | Represents that the asset was constructed or updated using a photo survey. While the Digital Twin model may reflect an accurate representation of the assets within the physical facility, the physical (dimensional) information is assumed/interpreted. |
| High | Survey | Represents that the level of accuracy mostly applies to certain assets within the Digital Twin like roads and terrain. |

TABLE 2

Enumerated Values of Asset Engineering Accuracy

| Asset Certainty Level | Asset Engineering Accuracy | |
|---|---|---|
| High | Digitally Verified | Represents that the asset engineering meta-data is digitally verified against as-built engineering documents like P&ID's (Process and Instrumentation) Diagrams and other digital engineering documents. |
| Medium | As Designed | Represents an assumed level of accuracy. While it may be assumed that asset's meta data is accurate, some deviations may occur caused by construction. |
| Medium | Field Verified | Represents that the asset may be constructed or updated against a field (facility) verified drawing or sketch. While the Digital Twin model may reflect an accurate representation of the assets within the physical facility, the meta data |

TABLE 2-continued

Enumerated Values of Asset Engineering Accuracy

| Asset Certainty Level | | Asset Engineering Accuracy |
|---|---|---|
| Low | As Observed | information was obtained through manual methods where human error should be considered. Represents that the asset is constructed or updated using a photo survey. While the Digital Twin model may reflect an accurate representation of the assets within the physical facility, the associated meta data is assumed/interpreted. |

TABLE 3

Enumerated Values of Virtual Asset State
Virtual Asset State

| Up to Date | Represents that the asset in physical facility was not changed after the virtual asset was last updated. |
|---|---|
| Pending Update | Represents that the virtual asset is potentially not up to date corresponding to its physical asset. The EAM system indicates that physical changes were performed affecting the state of the virtual asset. |

In an embodiment, the sustainable digital twin 200A asset certainty level assignment mechanism may be initiated by creating or generating the work order. For instance, the work order may include a workflow of a series of sequence of related tasks. The workflow may enable all managed entities (e.g., assets) by the sustainable digital twin system 200A to be updated. In an embodiment, the scope of work order may identify the virtual assets and other entities (e.g., knowledge views) that may be affected by the update. Each workflow task includes a field that indicates the source input required to conduct the task. For instance, the task that may need updating virtual assets using as-built point cloud data may have a source input field labeled "As Built Point Cloud."

In an embodiment, when such inputs are provided, the sustainable digital twin system 200A may assign suitable asset physical accuracy and asset engineering accuracy levels to the assets that may fall within the scope of the workorder. In an embodiment, the sustainable digital twin system 200A may be integrated with the organization's Enterprise Asset Management System (EAM). The EAM system may manage the physical assets within the facility. In an embodiment, a modification of the physical assets in the facility may be managed via EAM work orders. The sustainable digital twin system 200A working in cooperation with the EAM system may create the sustainable digital twin system 200A work order related to the EAM work order.

In an embodiment, the integrated artificial intelligence framework 212 may implement an execution of operations or functions that may define scope of work order or related tasks based on the content of the EAM work order. The integration of the sustainable digital twin system 200A with the EAM system may enable assigning the asset certainty virtual age level. In an embodiment, by querying the completed EAM work orders, the sustainable digital twin system 200A may be configured to identify the physical changes that occurred in the facility. The sustainable digital twin system 200A may identify assets that may potentially require updating due to changes in the physical facility by highlighting or providing notification of the work orders that may yet to be executed or published.

Figure 7:
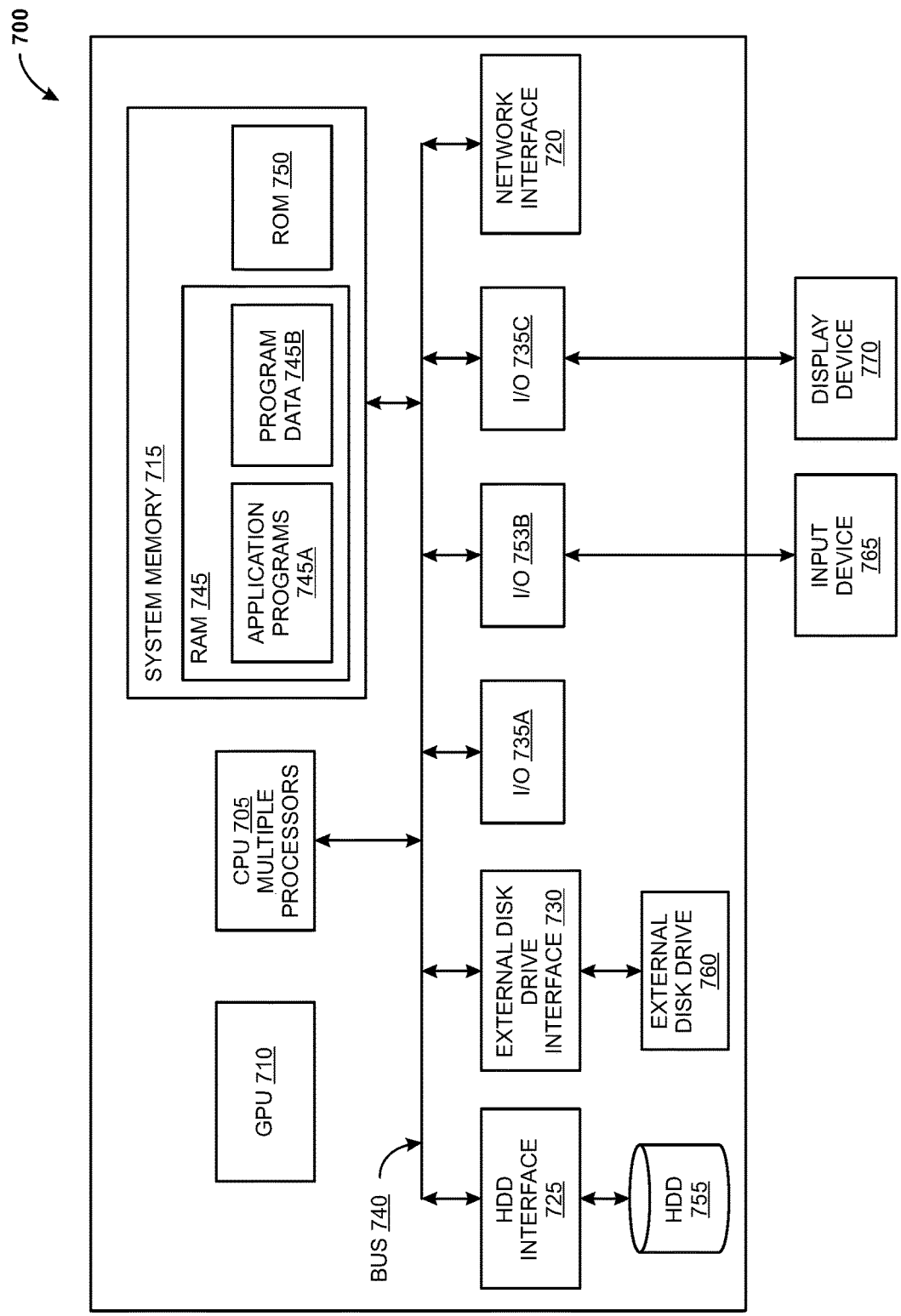
FIG. 7 is a block diagram illustrating an exemplary hardware configuration of a computer that may be used to implement components of a sustainable digital twin system, according to exemplary embodiments.

FIG. 7 is a block diagram illustrating an exemplary hardware configuration of computer 700 that may be used to implement components of a sustainable digital twin system 200A, according to exemplary embodiments. The computer 700 shown in FIG. 7 includes CPU 705, GPU 710, system memory 715, network interface 720, hard disk drive (HDD) interface 725, external disk drive interface 730 and input/output (I/O) interfaces 735A, 735B, 735C. These elements of the computer are coupled to each other via system bus 740. The CPU 705 may perform arithmetic, logic and/or control operations by accessing system memory 715. The CPU 705 may implement the processors of the exemplary devices and/or system described above. The GPU 710 may perform operations for processing graphic or AI tasks. In case computer 700 is used for implementing exemplary central processing device, GPU 710 may be GPU 710 of the exemplary central processing device as described above. The computer 700 does not necessarily include GPU 710, for example, in case computer 700 is used for implementing a device other than central processing device. The system memory 715 may store information and/or instructions for use in combination with the CPU 705. The system memory 715 may include volatile and non-volatile memory, such as random-access memory (RAM) 745 and read only memory (ROM) 750. A basic input/output system (BIOS) containing the basic routines that help to transfer information between elements within the computer 700, such as during start-up, may be stored in ROM 750. The system bus 740 may be any of several types of bus structures including a memory bus or memory controller, a peripheral bus, and a local bus using any of a variety of bus architectures.

The computer may include network interface 720 for communicating with other computers and/or devices via a network.

Further, the computer may include a hard disk drive (HDD) 755 for reading from and writing to a hard disk (not shown), and external disk drive 760 for reading from or writing to a removable disk (not shown). The removable disk may be a magnetic disk for a magnetic disk drive or an optical disk such as a CD ROM for an optical disk drive. The HDD 755 and external disk drive 760 are connected to the system bus 740 by HDD interface 725 and external disk drive interface 730, respectively. The drives and their associated non-transitory computer-readable media provide non-volatile storage of computer-readable instructions, data structures, program modules and other data for the general-purpose computer. The relevant data may be organized in a database, for example a relational or object database.

Although the exemplary environment described herein employs a hard disk (not shown) and an external disk (not shown), it should be appreciated by those skilled in the art that other types of computer readable media which can store data that is accessible by a computer, such as magnetic cassettes, flash memory cards, digital video disks, random access memories, read only memories, and the like, may also be used in the exemplary operating environment.

A number of program modules may be stored on the hard disk, external disk, ROM 750, or RAM 745, including an operating system (not shown), one or more application programs 745A, other program modules (not shown), and program data 745B. The application programs may include at least a part of the functionality as described above.

The computer 700 may be connected to input device 765 such as mouse and/or keyboard and display device 770 such as liquid crystal display, via corresponding I/O interfaces 735A to 735C and the system bus 740. In addition to an implementation using a computer 700 as shown in FIG. 7, a part or all the functionality of the exemplary embodiments described herein may be implemented as one or more hardware circuits. Examples of such hardware circuits may include but are not limited to: Large Scale Integration (LSI), Reduced Instruction Set Circuits (RISC), Application Specific Integrated Circuit (ASIC) and Field Programmable Gate Array (FPGA).

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details (and without applying to any networked environment or standard).

As used in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component.

The above descriptions and illustrations of embodiments, including what is described in the Abstract, is not intended to be exhaustive or to limit the one or more embodiments to the precise forms disclosed. While specific embodiments of, and examples for, the one or more embodiments are described herein for illustrative purposes, various equivalent modifications are possible within the scope, as those skilled in the relevant art will recognize. These modifications can be made in light of the above detailed description. Rather, the scope is to be determined by the following claims, which are to be interpreted in accordance with established doctrines of claim construction.

What is claimed is:

1. A system for detecting modifications of physical assets in a facility, comprising:
   a processor;
   a memory storing instructions for, when executed by the processor, causing the processor to perform the following steps:
      receive data associated with a plurality of physical assets, wherein the plurality of physical assets represents a plurality of physical objects in the facility;
      based on the received data, train at least one machine learning engine from a plurality of machine learning engines in an integrated artificial intelligence framework;
      based on the training, classify the plurality of physical assets by the integrated artificial intelligence framework, wherein classification consists of scanning the plurality of physical assets and producing a plurality of point clouds consisting of a 2-dimensional (2D) matrix including a plurality of rows and a plurality of columns of a plurality of 3-dimensional (3D) vertices, wherein the 3D vertices consists of a plurality of photographic images associated with the plurality of physical assets in the facility;
      based on the classification, identify a plurality of objects from the plurality of 3D vertices, wherein the identification consists of a mapping of the plurality of objects and the plurality of 3D vertices;
      based on the identification, extract one or more dimensional meta data and an asset classification from the plurality of 3D vertices;
      based on the extracted one or more dimensional meta data and the asset classification, generate a plurality of partially classified 3D virtual models corresponding to the plurality of physical assets in the facility;
      based on the plurality of partially classified 3D virtual models, generate a plurality of virtual assets, wherein the plurality of virtual assets includes the plurality of partially classified 3D virtual models corresponding to the plurality of physical assets, and a plurality of attributes associated with each physical asset;
      upon detecting a modification of at least one virtual asset, analyze the modification, wherein the modification is at least one of:
         a modification of at least one attribute associated with at least one virtual asset; and/or
         a modification of at least one data link from a plurality of data links between the plurality of virtual assets; and/or
         an addition of at least one new virtual asset corresponding to an addition of at least one new physical asset; and/or
         a deletion of at least one virtual asset corresponding to a deletion of at least one physical asset;
      based on the analysis, generate a plurality of recommendations including a corresponding modification of the at least one virtual asset;
      based on a plurality of validation rules, validate a linked asset data corresponding to at least one modified virtual asset asset;
      based on the validation and the modification of the at least one virtual asset, update the at least one virtual asset to reflect a corresponding modification; and
      display the plurality of virtual assets including the at least one modified virtual asset.

2. The system of claim 1, wherein the plurality of virtual assets includes one or more of a plurality of linked asset data and a corresponding graphical presentation associated with each virtual asset.

3. The system of claim 1, wherein the memory further stores instructions for, when executed by the processor, causing the processor to perform the step of: disaggregate the modification of the at least one virtual asset to create a disaggregation of the modification, wherein the disaggregation of the modification inhibits impacting one or more attributes associated with the at least one modified virtual asset.

4. The system of claim 1, wherein the memory further stores instructions for, when executed by the processor, causing the processor to perform the step of: based on the at least one modification, system to simulate an impact on a linked asset data associated with the at least one modified virtual asset and the one or more virtual assets.

5. The system of claim 1, wherein the memory further stores instructions for, when executed by the processor causing the processor to perform the step of: generate a plurality of recommendations based on the plurality of validation rules, wherein the plurality of recommendations is associated with updating the one or more virtual assets from the plurality of virtual assets.

6. The system of claim 1, wherein the plurality of virtual assets, further comprises:

a virtual asset template and a plurality of attributes associated with the virtual asset template; and a behavior and a plurality of attributes associated with the behavior.

7. The system of claim 1, wherein the plurality of virtual assets further comprises:

an asset data mapping information and a plurality of attributes associated with the asset data mapping information;

an asset data set and a plurality of attributes associated with the asset data set; and an asset data field and a plurality of attributes associated with the asset data field.

8. The system of claim 1, wherein the plurality of virtual assets further comprises:

a graphical presentation and a plurality of attributes associated with the graphical presentation;

an image associated with the graphical presentation and a plurality of attributes associated with the image;

3D primitives and a plurality of attributes associated with the 3D primitives; and a 3D mesh and a plurality of attributes associated with the 3D mesh.

9. The system of claim 1, wherein the memory further stores instructions for, when executed by the processor, causing the processor to perform the step of: generate a plurality of visualizations including the plurality of virtual assets, wherein at least one visualization displays at least one modification corresponding to the at least one modified virtual asset.

10. A method for detecting modifications of physical assets in a facility, comprising:

receiving data associated with a plurality of physical assets, wherein the plurality of physical assets represents a plurality of physical objects in the facility;

based on the received data, train at least one machine learning engine from a plurality of machine learning engines in an integrated artificial intelligence framework;

based on the training, classify the plurality of physical assets by the integrated artificial intelligence framework, wherein classification consists of scanning the plurality of physical assets and producing a plurality of point clouds consisting of a 2-dimensional (2D) matrix including a plurality of rows and a plurality of columns of a plurality of 3-dimensional (3D) vertices, wherein the 3D vertices consists of a plurality of photographic images associated with the plurality of physical assets in the facility;

based on the classification, identify a plurality of objects from the plurality of 3D vertices, wherein the identification consists of a mapping of the plurality of objects and the plurality of 3D vertices;

based on the identification, extract one or more dimensional meta data and an asset classification from the plurality of 3D vertices;

based on the extracted one or more dimensional meta data and the asset classification, generate a plurality of partially classified 3D virtual models corresponding to the plurality of physical assets in the facility;

based on the plurality of partially classified 3D virtual models, generating a plurality of virtual assets, wherein the plurality of virtual assets includes the plurality of partially classified 3D virtual models corresponding to the plurality of physical assets, and a plurality of attributes associated with each physical asset;

upon detecting a modification of at least one virtual asset, analyzing the modification, wherein the modification is at least one of:

a modification of at least one attribute associated with at least one virtual asset; and/or a modification of at least one data link from a plurality of data links between the plurality of virtual assets; and/or an addition of at least one new virtual asset corresponding to an addition of at least one new physical asset; and/or a deletion of at least one virtual asset corresponding to a deletion of at least one physical asset;

based on the analysis, generating a plurality of recommendations including a corresponding modification of the at least one virtual asset;

based on a plurality of modified virtual asset, validating a linked asset data corresponding to at least one modified virtual asset;

based on the validation and the modification of the at least one virtual asset, updating the at least one virtual asset to reflect a corresponding modification; and displaying the plurality of virtual assets including the at least one modified virtual asset.

11. The method of claim 10, wherein the plurality of virtual assets includes one or more of a plurality of linked asset data and a corresponding graphical presentation associated with each virtual asset.

12. The method of claim 10, further comprising: disaggregating the modification of the at least one virtual asset to create a disaggregation of the modification, wherein the disaggregation of the modification inhibits impacting one or more attributes associated with the at least one modified virtual asset.

13. The method of claim 10, further comprising: based on the at least one modification, simulating an impact on a linked asset data associated with the at least one modified virtual asset and the one or more virtual assets.

14. The method of claim 10, further comprising: generating a plurality of recommendations based on the plurality of validation rules, wherein the plurality of recommendations is associated with updating the one or more virtual assets from the plurality of virtual assets.

15. The method of claim 10, wherein the plurality of virtual assets, further comprises:

a virtual asset template and a plurality of attributes associated with the virtual asset template; and a behavior and a plurality of attributes associated with the behavior.

16. The method of claim 10, wherein the plurality of virtual assets further comprises:

an asset data mapping information and a plurality of attributes associated with the asset data information;

an asset data set and a plurality of attributes associated with the asset data set; and an asset data field and a plurality of attributes associated with the asset data field.

17. The method of claim 10, wherein the plurality of virtual assets further comprises:

a graphical presentation and a plurality of attributes associated with the graphical presentation;

an image associated with the graphical presentation and a plurality of attributes associated with the image;

3D primitives and a plurality of attributes associated with the 3D primitives; and a 3D mesh and a plurality of attributes associated with the 3D mesh.

18. The method of claim 10, further comprising: generating a plurality of visualizations including the plurality of virtual assets, wherein at least one visualization displays at least one modification corresponding to the at least one modified virtual asset.

19. A non-transitory computer-readable device having instructions stored thereon that, when executed by at least one computing device, cause the at least one computing device to perform operations comprising:

receiving data associated with a plurality of physical assets, wherein the plurality of physical assets represents a plurality of physical objects in a facility;

based on the received data, train at least one machine learning engine from a plurality of machine learning engines in an integrated artificial intelligence framework;

based on the training, classify the plurality of physical assets by the integrated artificial intelligence framework, wherein classification consists of scanning the plurality of physical assets and producing a plurality of point clouds consisting of a 2-dimensional (2D) matrix including a plurality of rows and a plurality of columns of a plurality of 3-dimensional (3D) vertices, wherein the 3D vertices consists of a plurality of photographic images associated with the plurality of physical assets in the facility;

based on the classification, identify a plurality of objects from the plurality of 3D vertices, wherein the identification consists of a mapping of the plurality of objects and the plurality of 3D vertices;

based on the identification, extract one or more dimensional meta data and an asset classification from the plurality of 3D vertices;

based on the extracted one or more dimensional meta data and the asset classification, generate a plurality of partially classified 3D virtual models corresponding to the plurality of physical assets in the facility;

based on the plurality of partially classified 3D virtual models, generating a plurality of virtual assets, wherein the plurality of virtual assets includes the plurality of partially classified 3D virtual models corresponding to the plurality of physical assets, and a plurality of attributes associated with each physical asset;

upon detecting a modification of at least one virtual asset, analyzing the modification, wherein the modification is at least one of:

a modification of at least one attribute associated with at least one virtual asset; and/or a modification of at least one data link from a plurality of data links between the plurality of virtual assets; and/or an addition of at least one new virtual asset corresponding to an addition of at least one new physical asset; and/or a deletion of at least one virtual asset corresponding to a deletion of at least one physical asset;

based on the analysis, generating a plurality of recommendations including a corresponding modification of the at least one virtual asset;

based on a plurality of validation rules, validating a linked asset data corresponding to at least one modified virtual asset;

based on the validation and the modification of the at least one virtual asset, updating the at least one virtual asset to reflect a corresponding modification; and displaying the plurality of virtual assets including the at least one modified virtual asset.

20. The non-transitory computer-readable device of claim 19, wherein the instructions stored, when executed by the at least one computing device, cause the at least one computing device to further perform: generating a plurality of visualizations including the plurality of virtual assets, wherein at least one visualization displays at least one modification corresponding to the at least one modified virtual asset.

* * * * *